(12) United States Patent
Song et al.

(10) Patent No.: US 11,894,071 B2
(45) Date of Patent: Feb. 6, 2024

(54) NON-VOLATILE MEMORY WITH DIFFERENTIAL TEMPERATURE COMPENSATION FOR BULK PROGRAMMING

(71) Applicant: SanDisk Technologies LLC, Addison, TX (US)

(72) Inventors: Yi Song, San Jose, CA (US); Dengtao Zhao, Santa Clara, CA (US); Sarath Puthenthermadam, San Jose, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/549,457

(22) Filed: Dec. 13, 2021

(65) Prior Publication Data

US 2023/0197168 A1 Jun. 22, 2023

(51) Int. Cl.
*G11C 16/28* (2006.01)
*G11C 16/10* (2006.01)
*G11C 7/04* (2006.01)
*G11C 16/26* (2006.01)

(52) U.S. Cl.
CPC ............. *G11C 16/28* (2013.01); *G11C 7/04* (2013.01); *G11C 16/10* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 7,391,650 B2 | 6/2008 | Mokhlesi et al. |
| 7,583,535 B2 | 9/2009 | Sekar et al. |
| 7,755,946 B2 | 7/2010 | Dunga et al. |
| 7,974,133 B2 | 7/2011 | Dunga et al. |
| 7,974,134 B2 | 7/2011 | Zhang et al. |
| 8,582,381 B2 | 11/2013 | Oowada et al. |
| 8,611,157 B2 | 12/2013 | Dutta |
| 9,036,438 B2 | 5/2015 | Hemink et al. |
| 9,583,198 B1 | 2/2017 | Pang et al. |
| 10,026,483 B1 | 7/2018 | Shah et al. |
| 10,496,450 B2 | 12/2019 | Zhang et al. |
| 10,636,488 B2 | 4/2020 | Lin et al. |
| 11,074,976 B2 | 7/2021 | Rabkin et al. |
| 2013/0163342 A1 | 6/2013 | Dutta et al. |
| 2013/0308390 A1 | 11/2013 | Lee |
| 2016/0086674 A1 | 3/2016 | Ray et al. |
| 2016/0117216 A1 | 4/2016 | Muchherla et al. |
| 2017/0255403 A1 | 9/2017 | Sharon et al. |
| 2017/0309344 A1 | 10/2017 | Dutta et al. |

(Continued)

OTHER PUBLICATIONS

Song, et al., "Non-Volatile Memory With Differential Temperature Compensation for Super Page Programming," U.S. Appl. No. 17/549,471, filed Dec. 13, 2021.

(Continued)

*Primary Examiner* — Kretelia Graham
(74) *Attorney, Agent, or Firm* — Vierra Magen Marcus LLP

(57) ABSTRACT

A system has been described that performs differential temperature compensation based on a differential between the temperature at time of programming and temperature at time of reading for a set of data. Differential temperature compensation is useful for bulk programming/reading (e.g., many pages of data) and/or programming/reading super pages of data (multiple pages residing on different memory die).

13 Claims, 27 Drawing Sheets

(56) References Cited

U.S. PATENT DOCUMENTS

| | | |
|---|---|---|
| 2018/0143788 A1 | 5/2018 | Yadav et al. |
| 2018/0293029 A1 | 10/2018 | Achtenberg et al. |
| 2019/0267054 A1 | 8/2019 | Thalaimalaivanaraj et al. |
| 2020/0201561 A1 | 6/2020 | Mun et al. |
| 2021/0050054 A1 | 2/2021 | Ray et al. |

OTHER PUBLICATIONS

PCT International Search Report and Written Opinion dated Oct. 14, 2022, PCT Patent Application No. PCT/US2022/030479.
PCT International Search Report and Written Opinion dated Oct. 25, 2022, PCT Patent Application No. PCT/US2022/030478.
Restriction Requirement in U.S. Appl. No. 17/549,471, dated Sep. 15, 2023.
Response to Restriction Requirement in U.S. Appl. No. 17/549,471, filed Oct. 16, 2023.

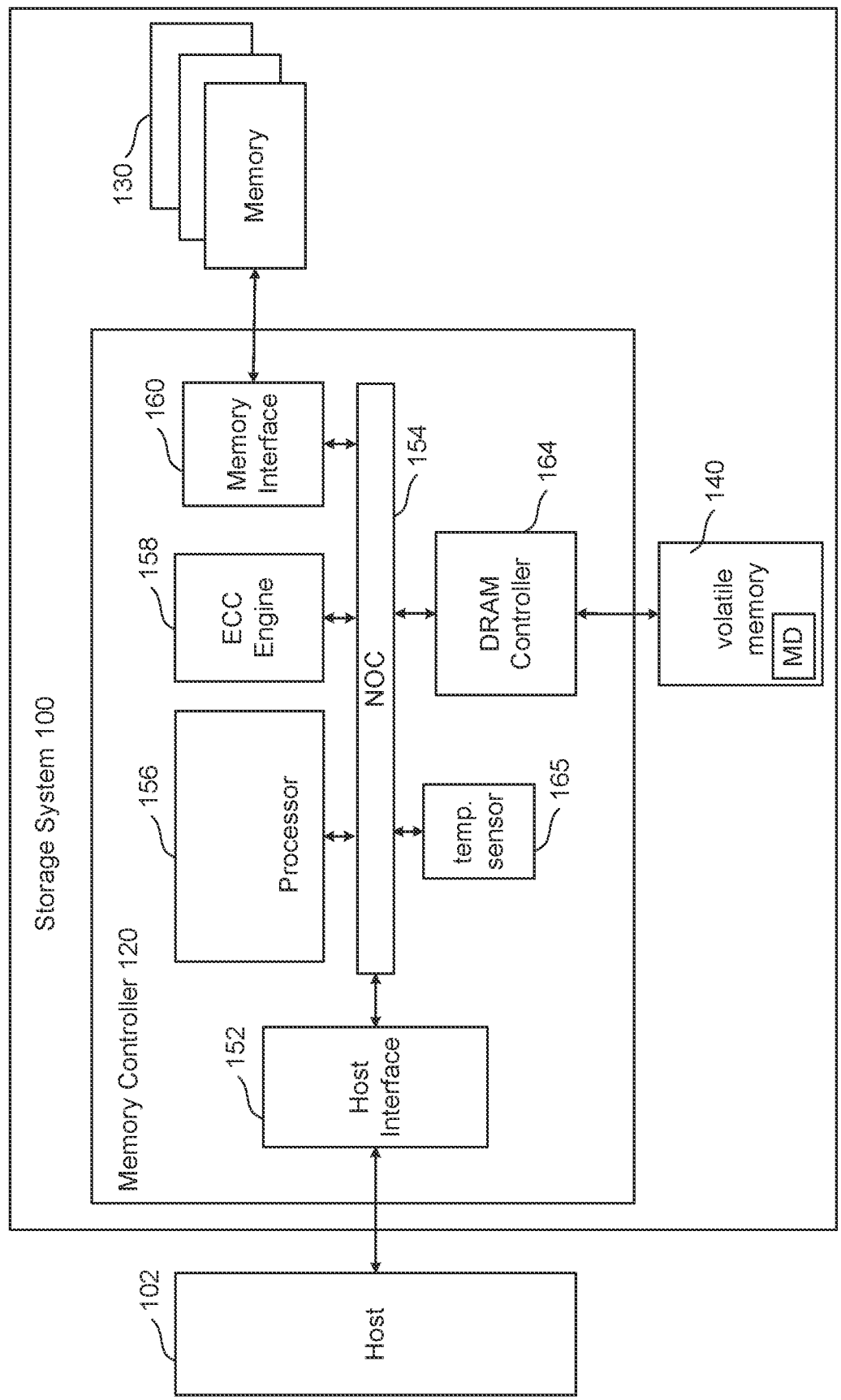

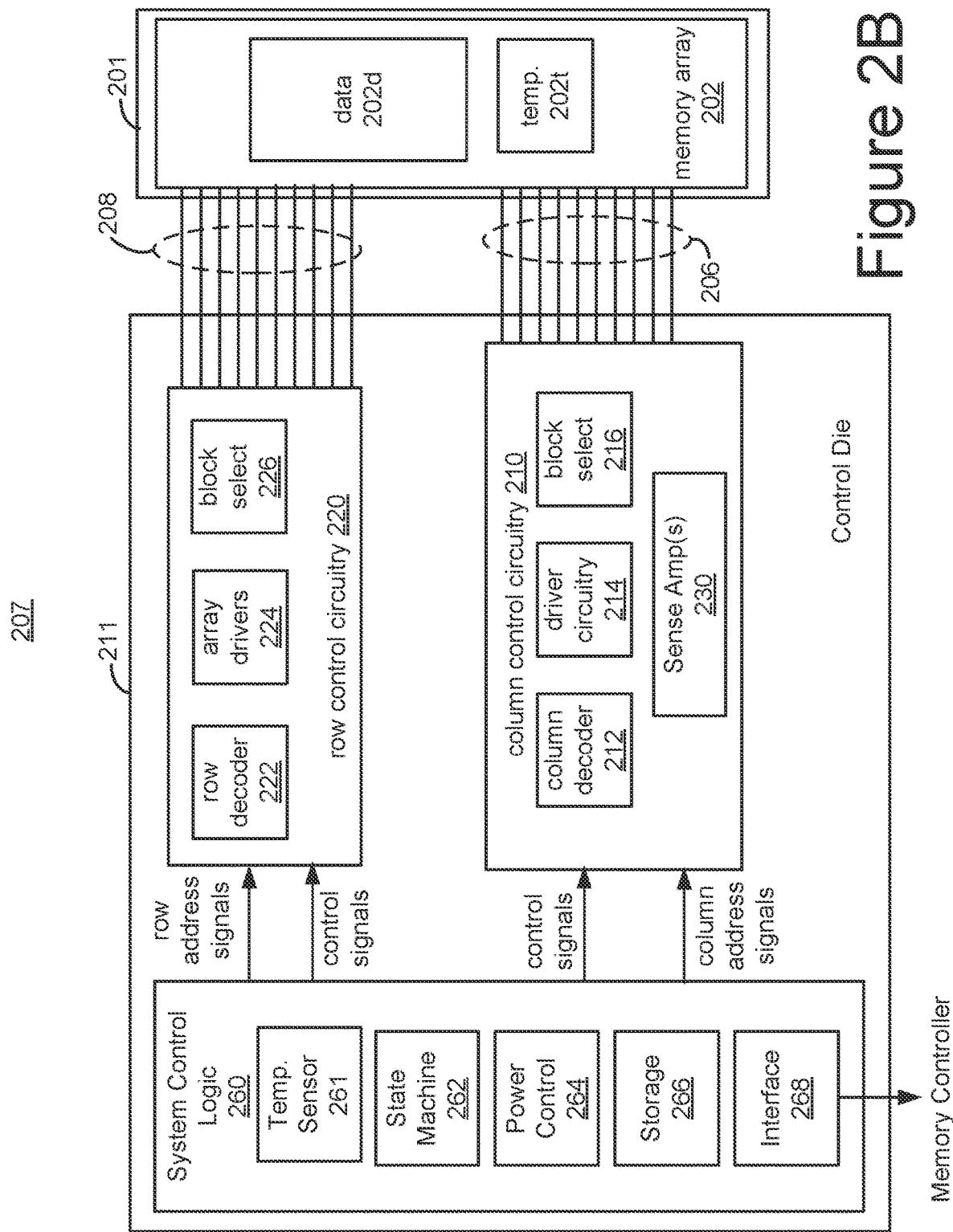

Figure 4C
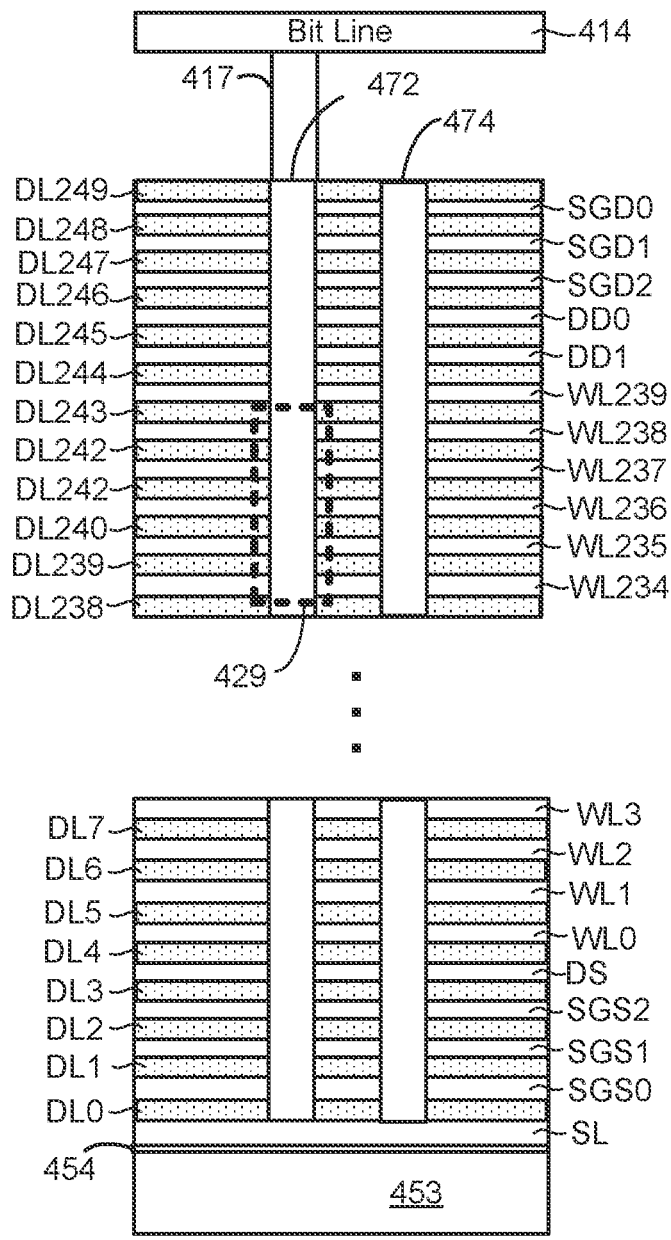
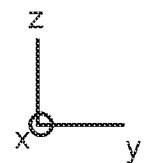

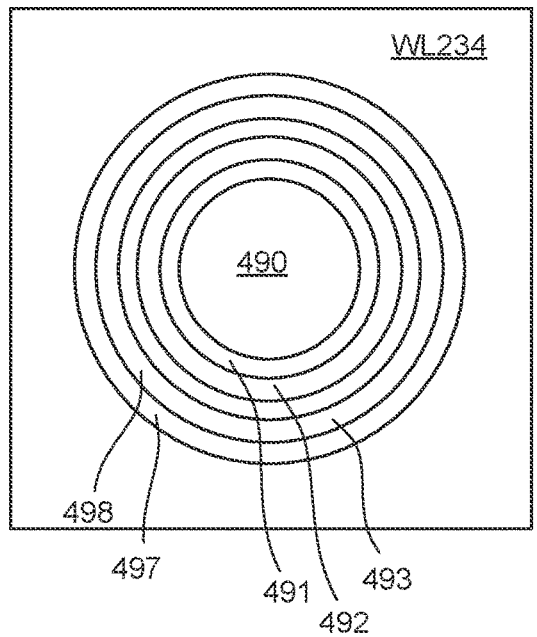
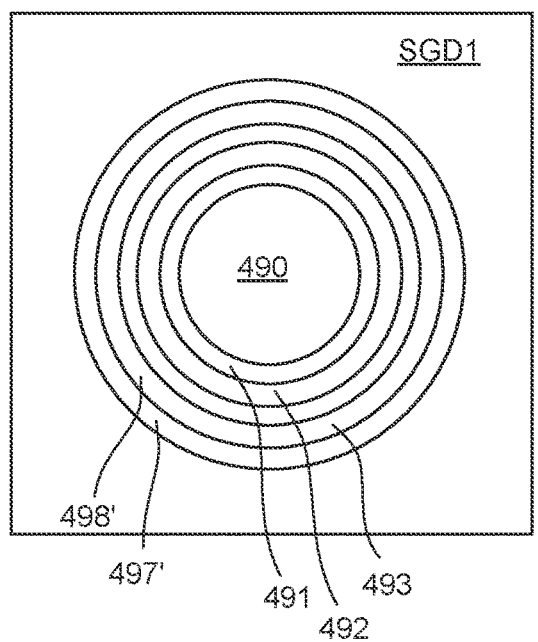
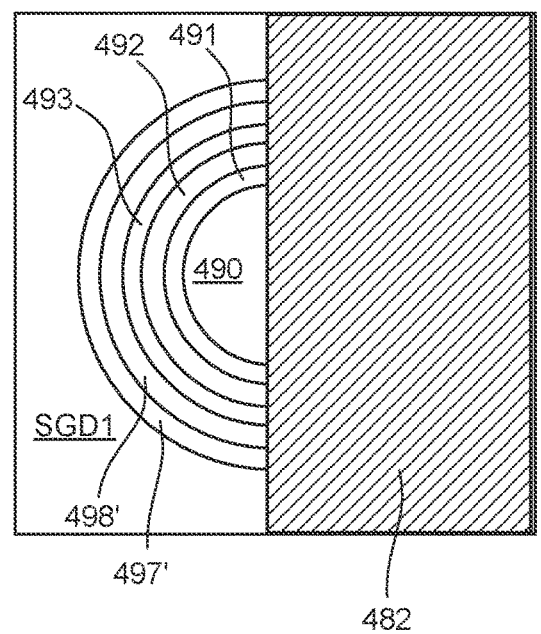

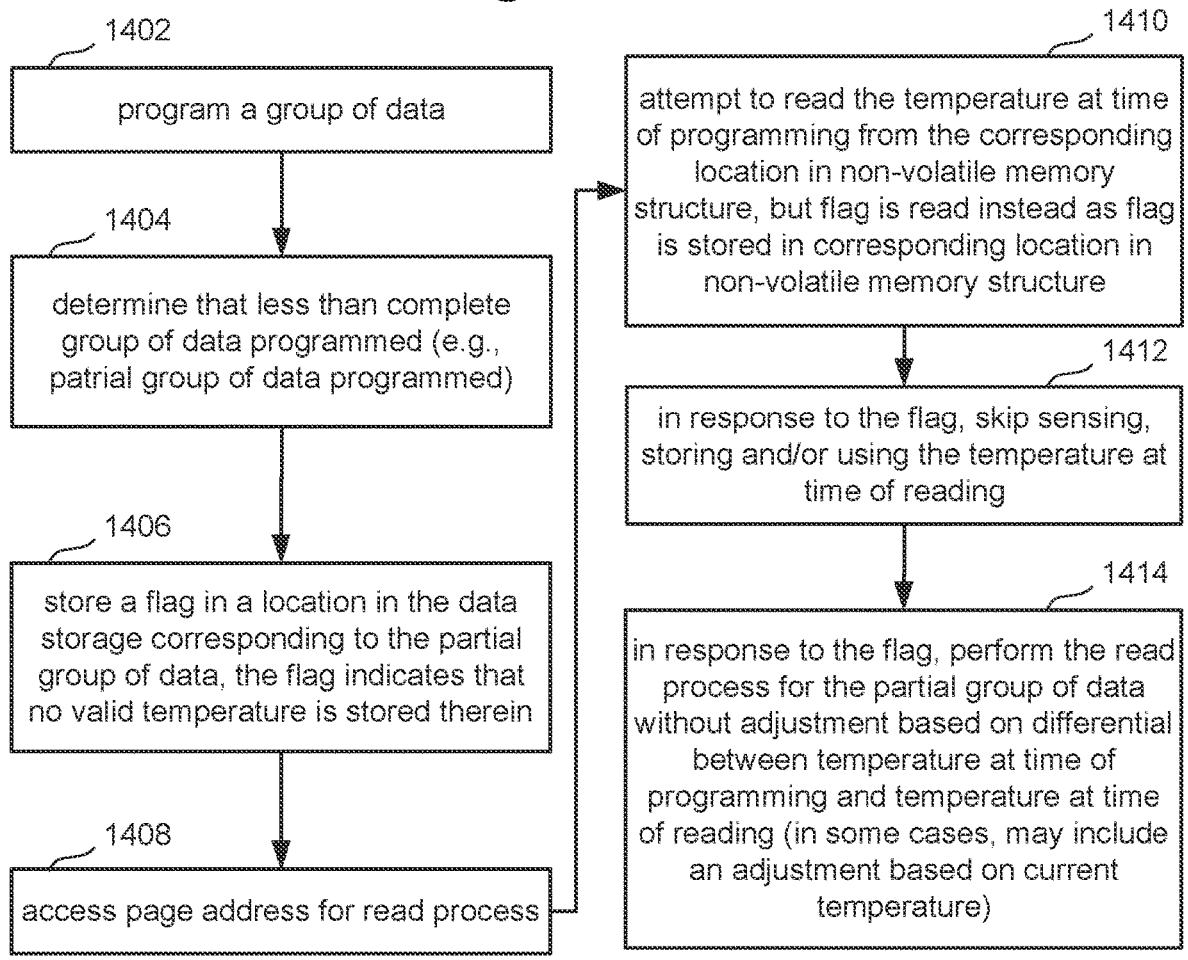

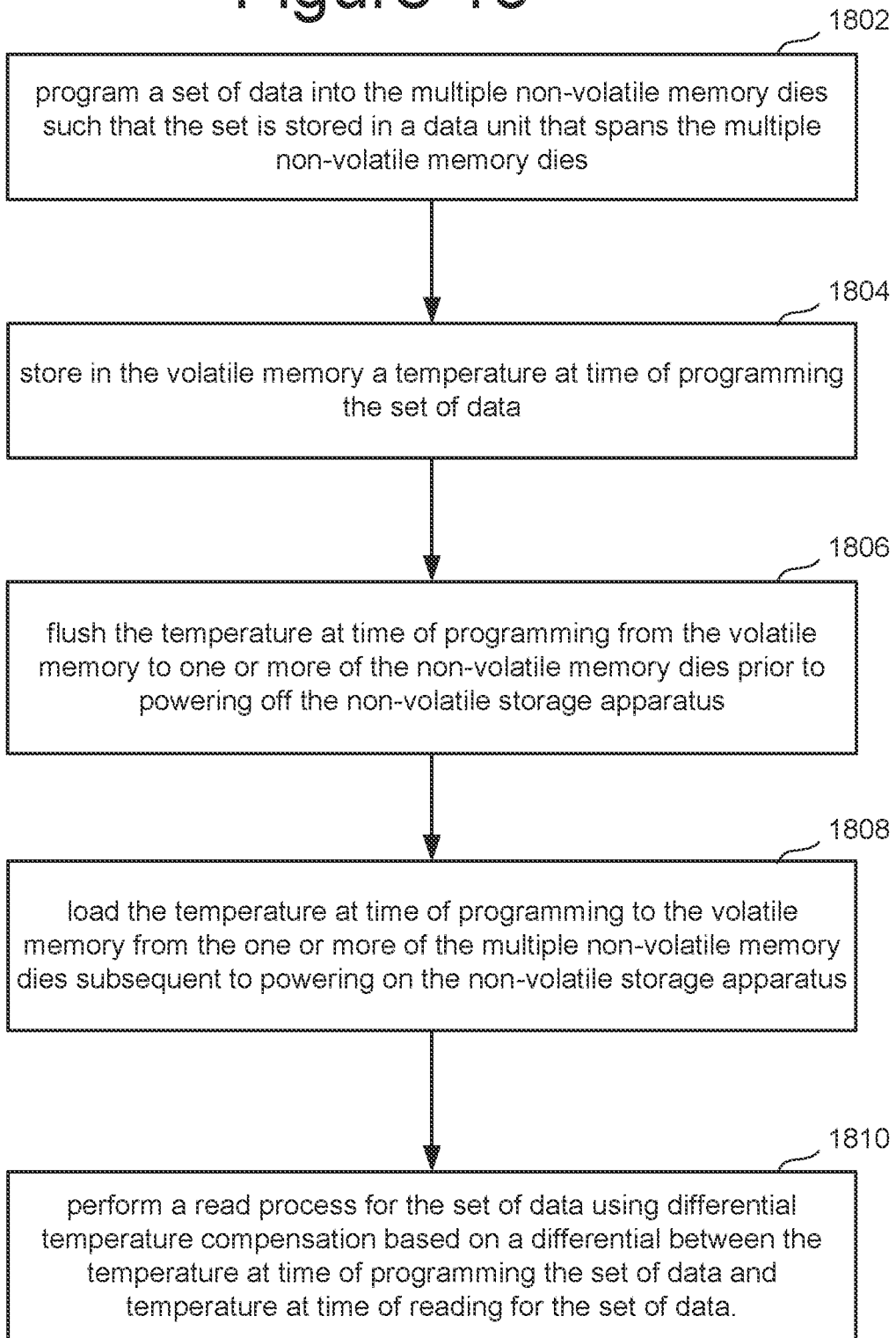

NON-VOLATILE MEMORY WITH DIFFERENTIAL TEMPERATURE COMPENSATION FOR BULK PROGRAMMING

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 1 is a block diagram depicting one embodiment of a storage system.

FIG. 2B is a block diagram of one embodiment of an integrated memory assembly.

FIG. 4C depicts a cross sectional view of a portion of one embodiment of a block of memory cells.

FIG. 4G depicts a cross section of as memory hole that implements a vertical NAND string.

FIG. 4H depicts a cross section of as memory hole that implements a vertical NAND string.

FIG. 4I depicts a cross section of as memory hole that implements a vertical NAND string.

FIG. 13 is a flow chart describing one embodiment of a process for programming and reading data with differential temperature compensation.

FIG. 14 is a flow chart describing one embodiment of a process for programming and reading data without using differential temperature compensation.

FIG. 18 is a flow chart describing one embodiment of a process for programming and reading data with differential temperature compensation.

DETAILED DESCRIPTION

Figure 2A:
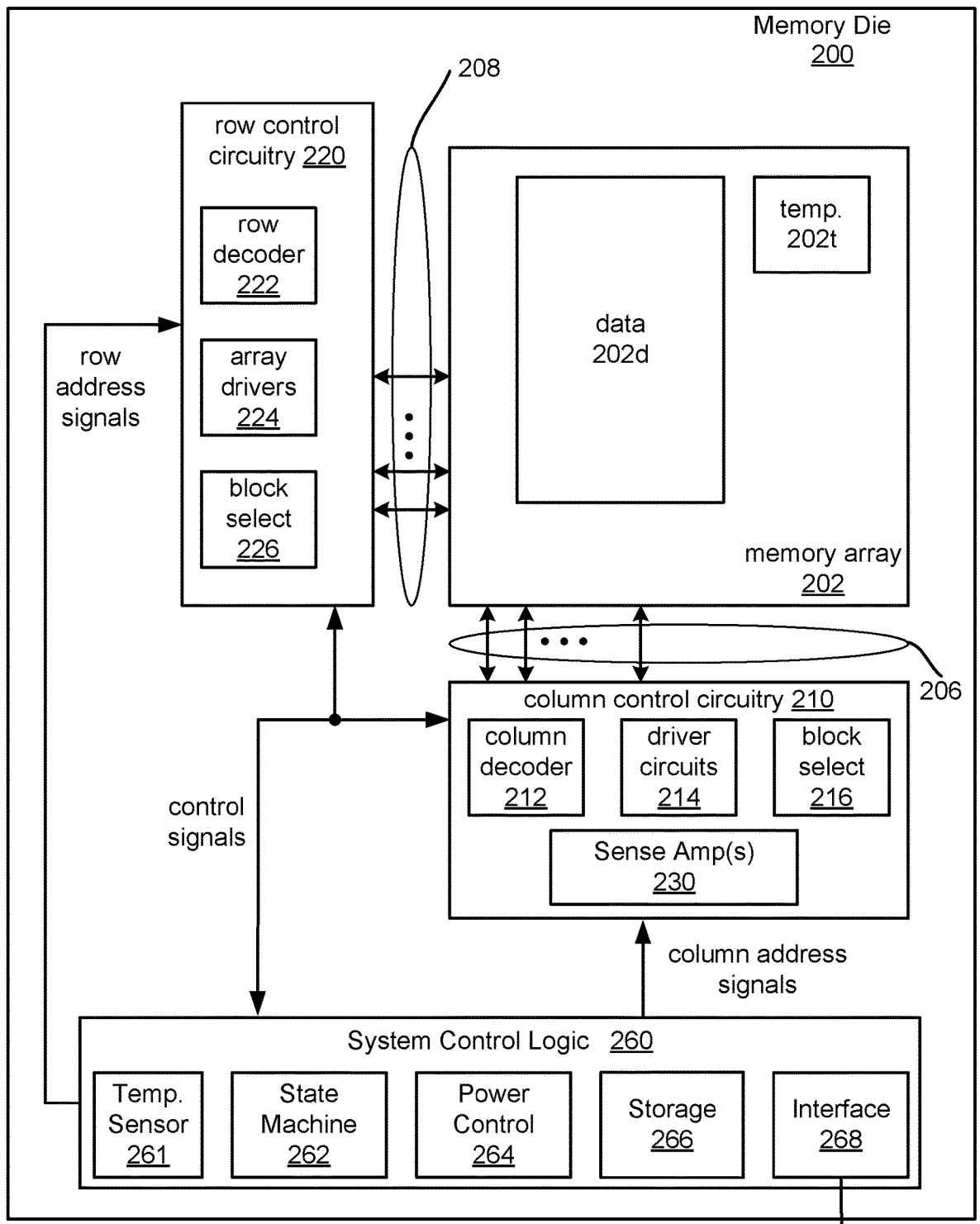
FIG. 2A is a block diagram of one embodiment of a memory die.

It has been observed that the operation and behavior of integrated circuits, including non-volatile storage systems implemented on integrated circuits, can be effected by temperature. For example, if data is programmed at a first temperature and read back at a significantly different temperature, it is possible that errors in the data can occur.

Some prior memory systems do compensate for temperature by adjusting operation based on a current temperature. Some systems use a temperature compensation coefficient referred to as TCO. In one embodiment, TCO indicates how much the threshold voltage of the memory cell changes per degree Celsius temperature change. Some prior devices may also use advanced memory controller techniques to optimize the read compare voltages by dynamically measuring the threshold voltage distributions and updating read compare voltages based on the measured threshold voltage distributions.

Although prior memory systems may provide some compensation for temperature by adjusting operation based on a current temperature, there may be situations where a large difference in temperature between when data is programmed and when data is read can cause errors, even if the memory system is providing some compensation for temperature by adjusting operation based on a current temperature. Therefore, it is proposed to provide temperature compensation based on a difference between temperature at the time data is programmed to non-volatile memory cells and temperature at the time the same data is read from the same non-volatile memory cells. This temperature compensation based on a difference between temperature at the time data is programmed and temperature at the time the data is read is referred to as differential temperature compensation.

Differential temperature compensation is useful for bulk programming/reading (e.g., many pages of data) and/or programming/reading super pages of data (multiple pages residing on different memory die). For example, one embodiment includes a non-volatile storage apparatus, comprising: a plurality of non-volatile memory cells, and a control circuit connected to the memory cells. The memory cells are configured to store data. The data is divided into a plurality of groups of data. The control circuit is configured to: program and read with differential temperature compensation based on a differential between temperature at time of programming and temperature at time of reading for data programmed as a complete group of data, and program and read without differential temperature compensation for data programmed as a partial group of data.

Another embodiment includes a non-volatile storage apparatus, comprising: a volatile memory; multiple non-volatile memory dies (each comprising a plurality of non-volatile memory cells) and a managing circuit connected to the non-volatile memory dies and the volatile memory. The managing circuit is configured to: program a set of data into the multiple non-volatile memory dies such that the set is stored in a data unit that spans the multiple non-volatile memory dies; store in the volatile memory a temperature at time of programming the set of data; flush the temperature at time of programming from the volatile memory to one or more of the non-volatile memory dies prior to powering off the non-volatile storage apparatus; load the temperature at time of programming to the volatile memory from the one or more of the multiple non-volatile memory dies subsequent to powering on the non-volatile storage apparatus; and perform a read process for the set of data using differential temperature compensation.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables") and other metadata MD for the data stored in non-volatile memory 130. In one embodiment, storage system 100 includes a temperature sensor 165, which can be any temperature sensor known in the art.

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202. In some embodiments, system control logic 260 includes temperature sensor 261, which can be any suitable temperature sensor known in the art.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

In one embodiment, memory structure 202 can store host/user data 202$d$ and temperature data 202$t$. For example, in one example implementation, each page, block, set of pages, set of blocks, etc. will correspond to a specific location in a data structure for temperature data 202$t$. When each page, block, set of pages, set of blocks, etc. are programmed, the a temperature is sensed by temperature sensor 26, temperature sensor 165 of the memory controller 120 or another temperature sensor and the measured temperature is stored in the corresponding specific location in the data structure for temperature data 202$t$. In one example embodiment, the temperature is stored as a two byte temperature code.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
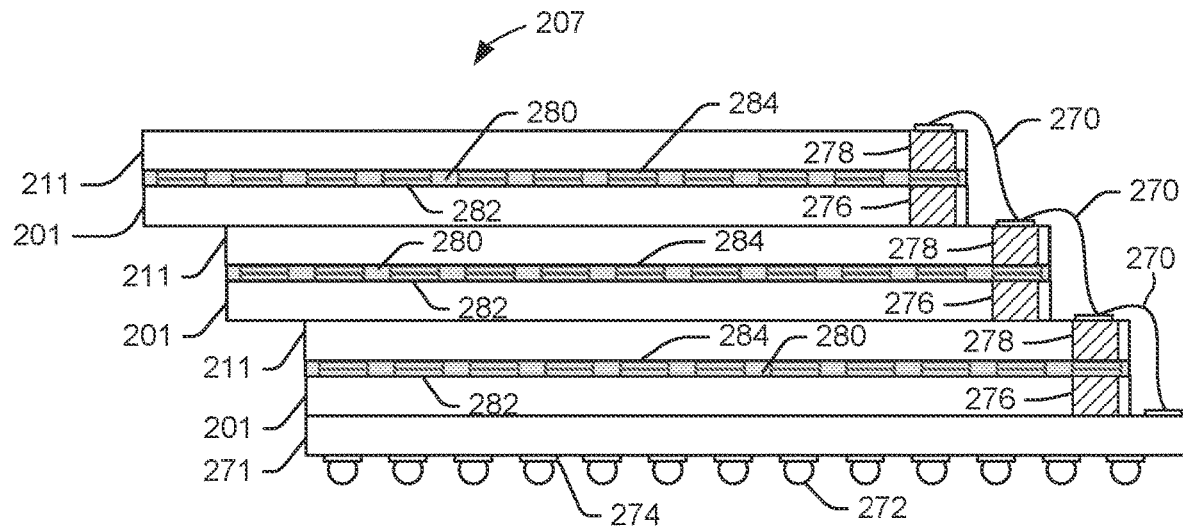
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
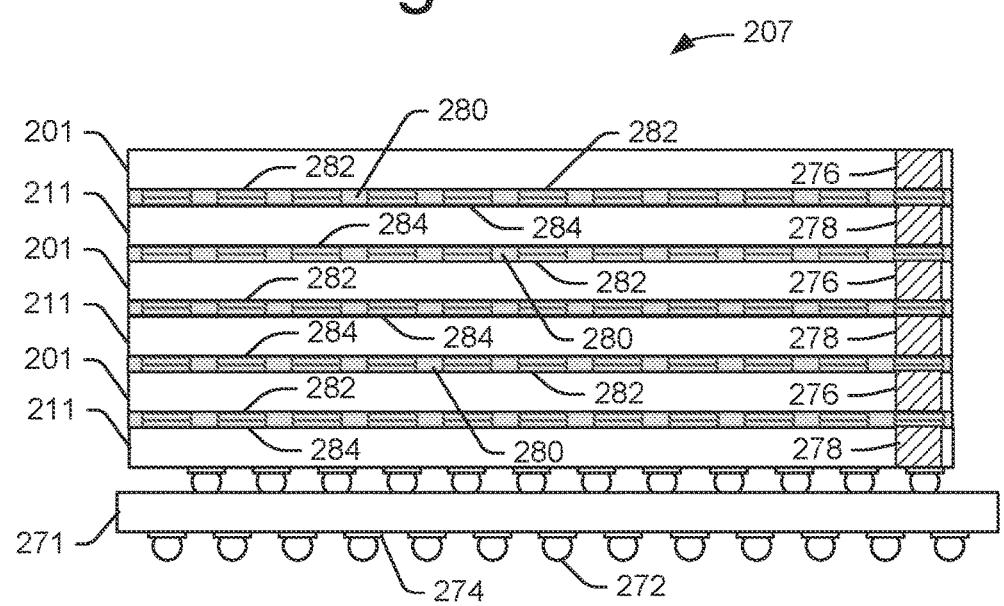

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
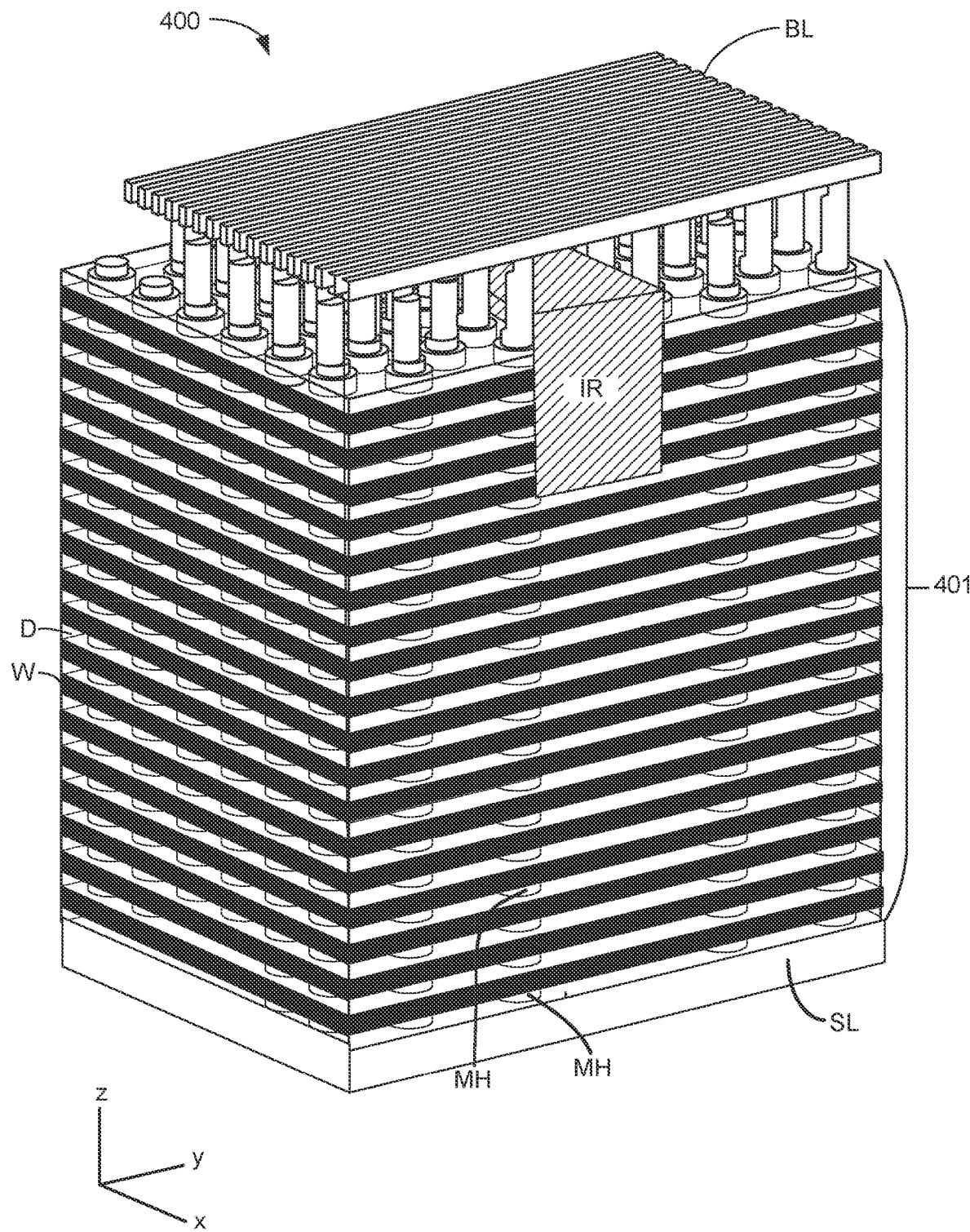
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
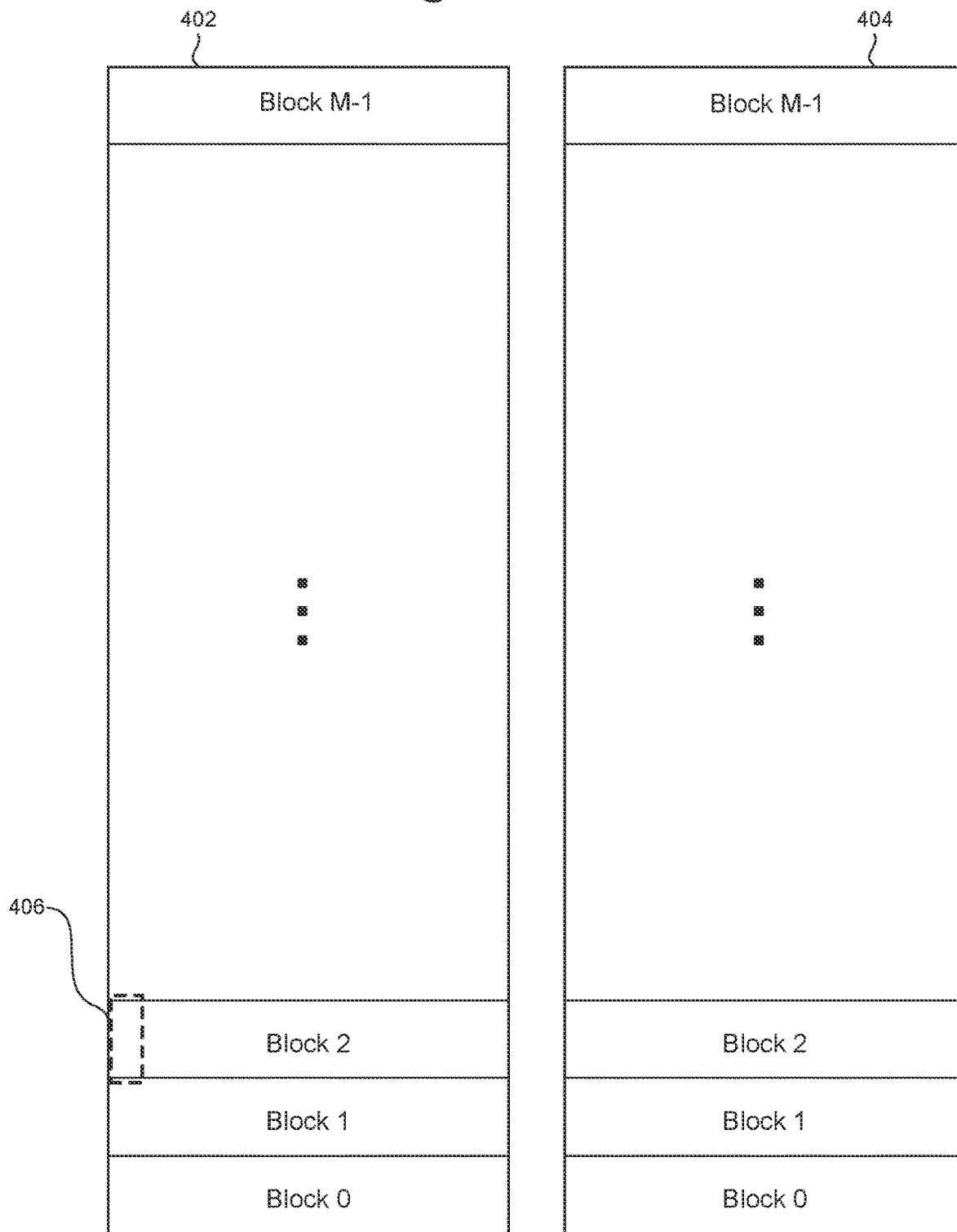
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight planes.

Figure 4B:
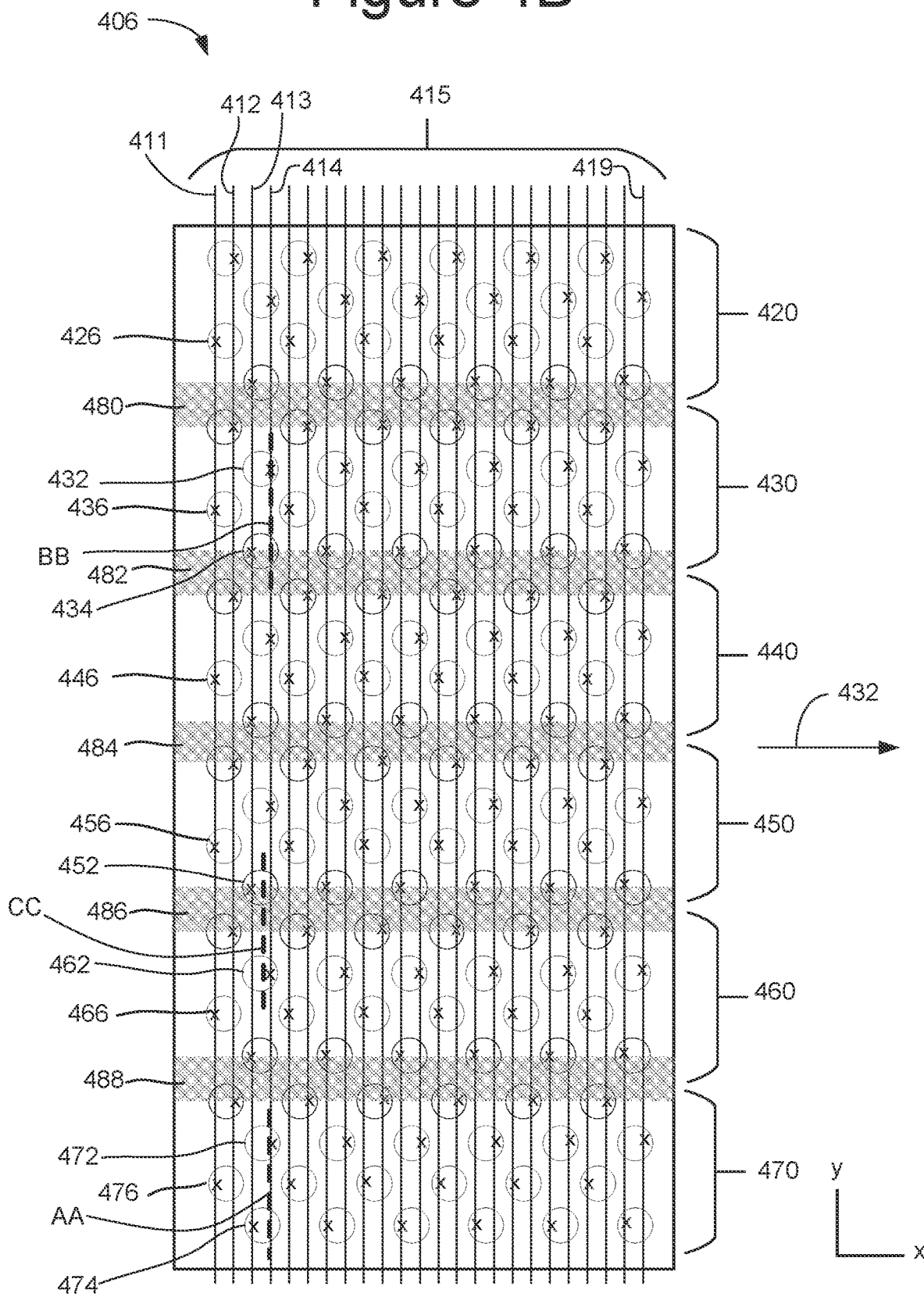
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
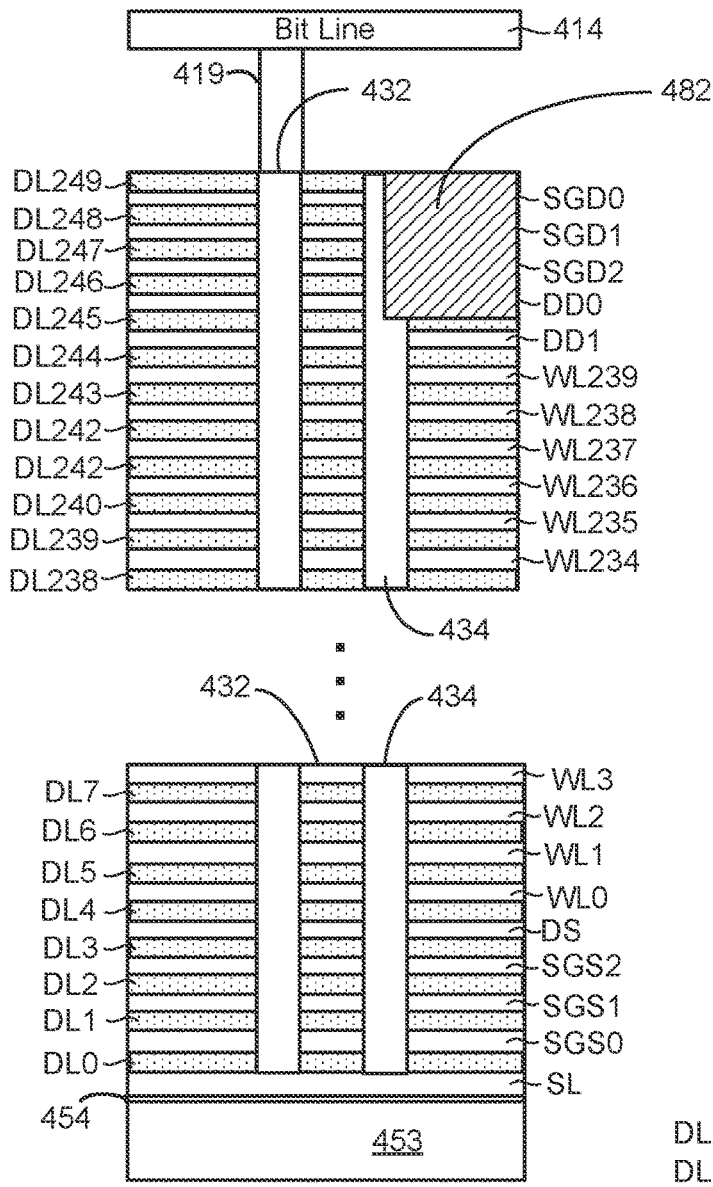
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with SiO$_2$.

Figure 4E:
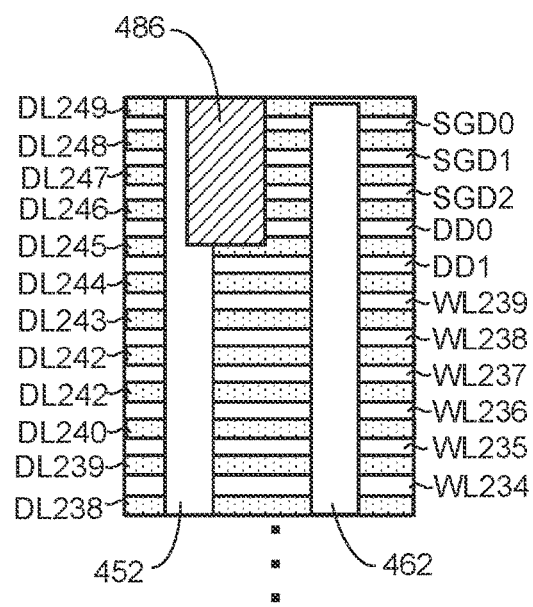
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
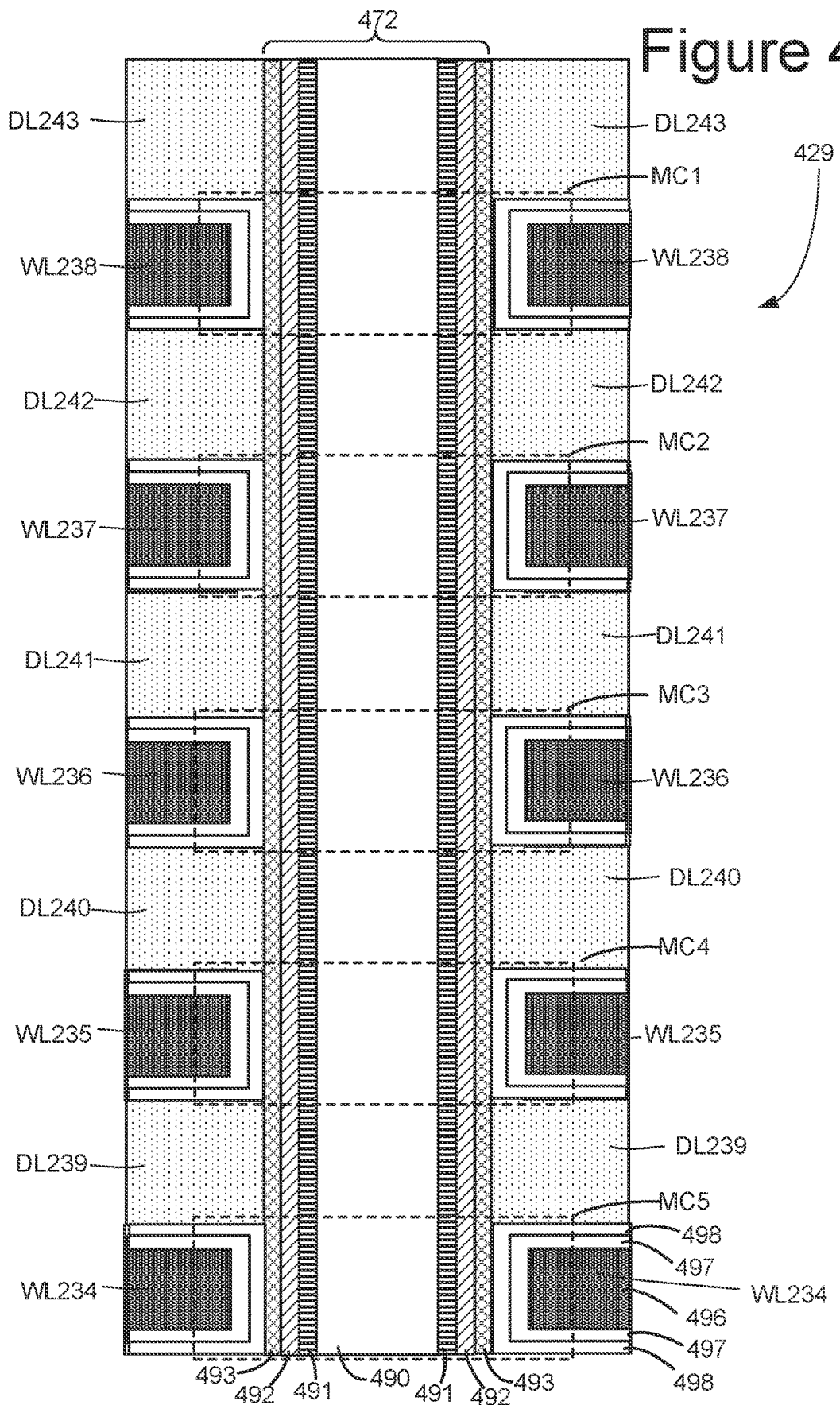
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as SiO$_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
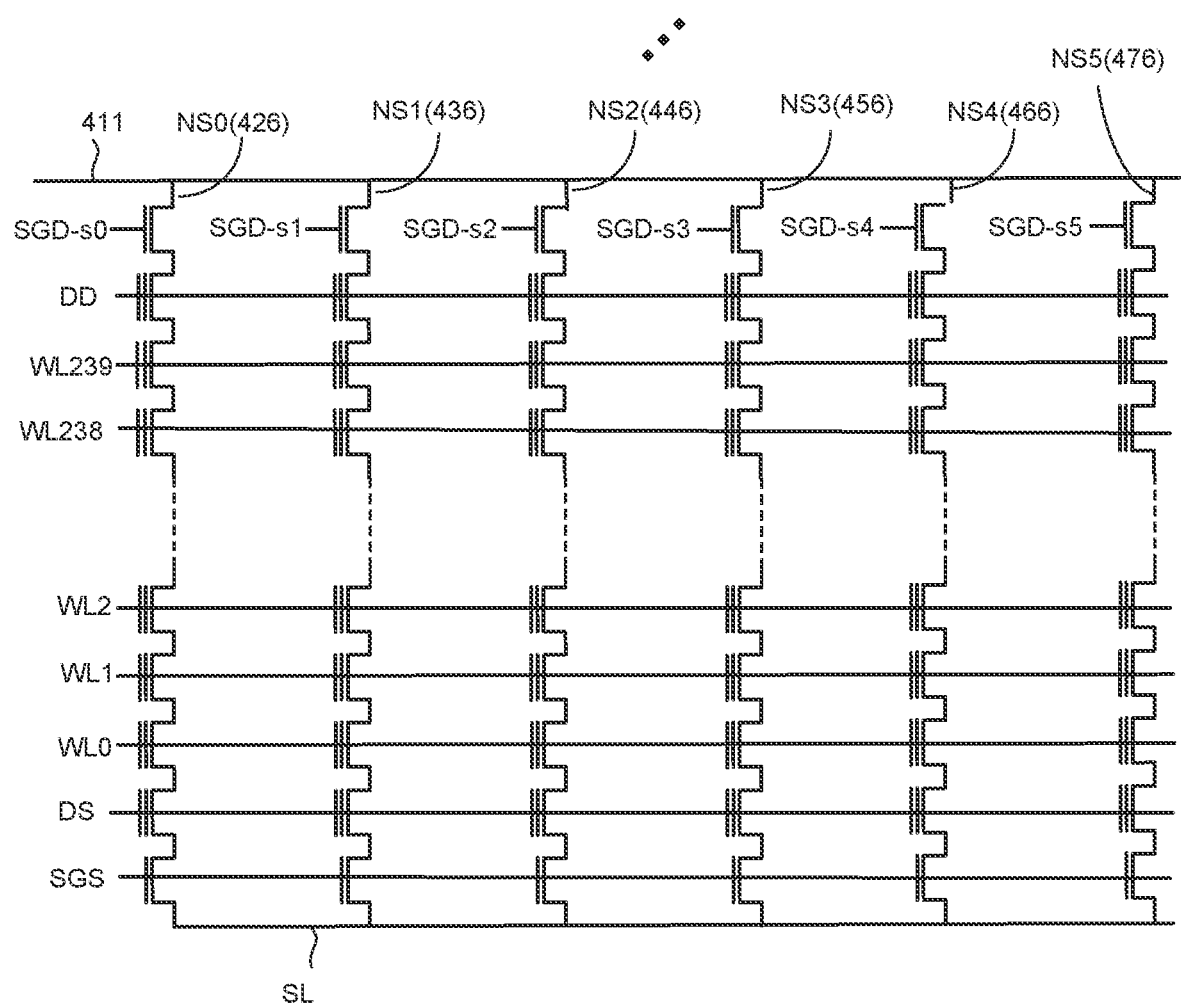
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

In one embodiment, a page of data is the unit of programming. That is, a page of data is the number of bits programmed concurrently. For example, if D memory cells are needed to store a page of data, then the system will have at least D sense amplifiers. In one embodiment, a page of data represents all of the data stored by memory cells cone ted to the same word line and that are in the same sub-block.

Although the example memories of FIGS. 4-4J are three dimensional memory structure that includes vertical NAND strings with charge-trapping material, other (2D and 3D) memory structures can also be used with the technology described herein.

Figure 5A:
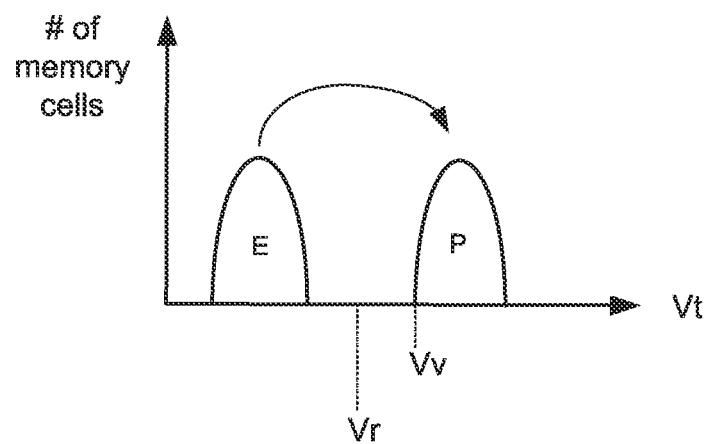
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
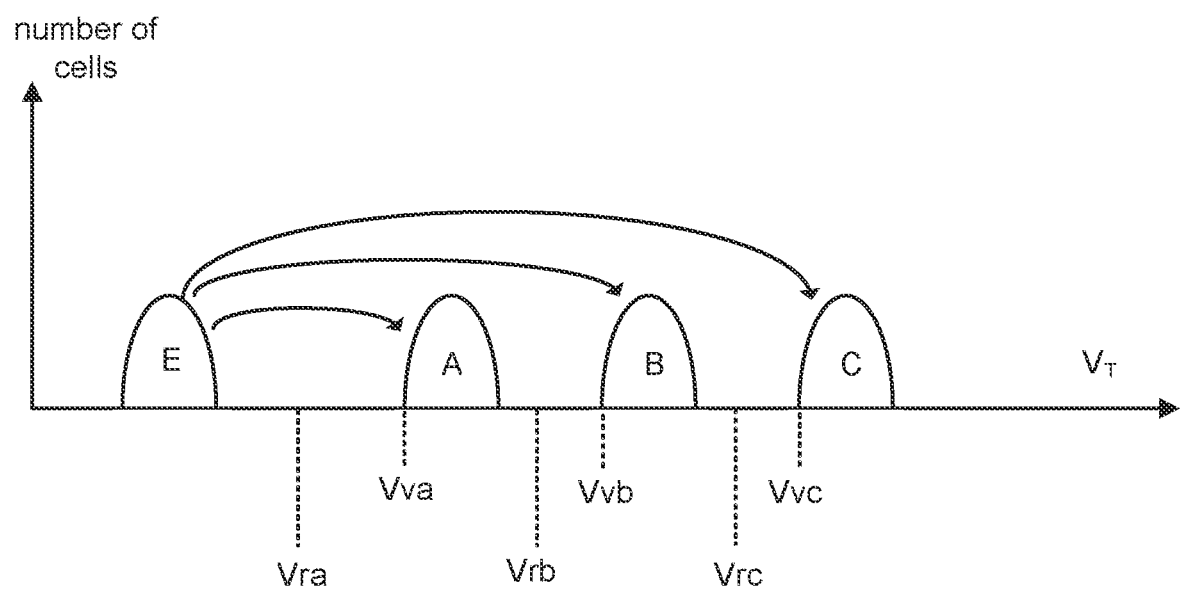
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
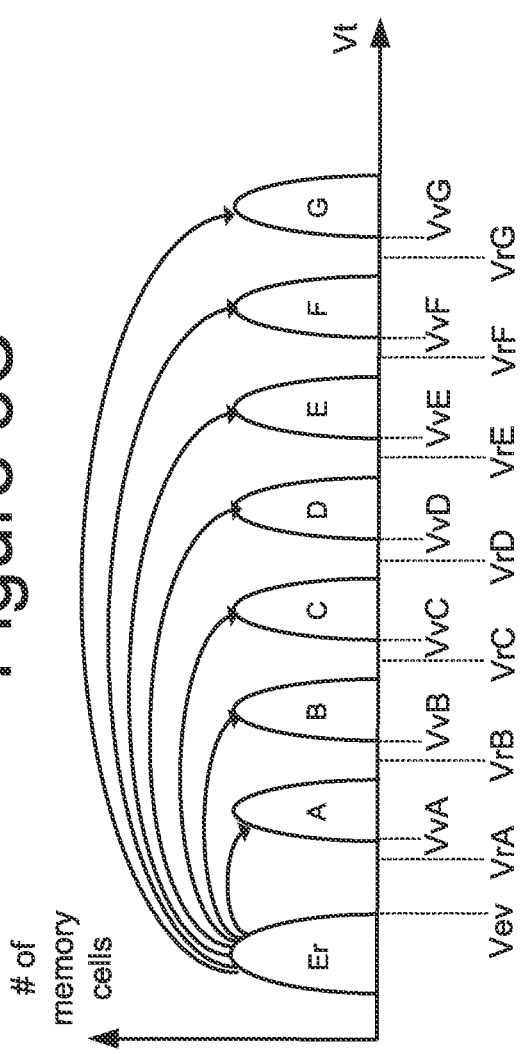
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
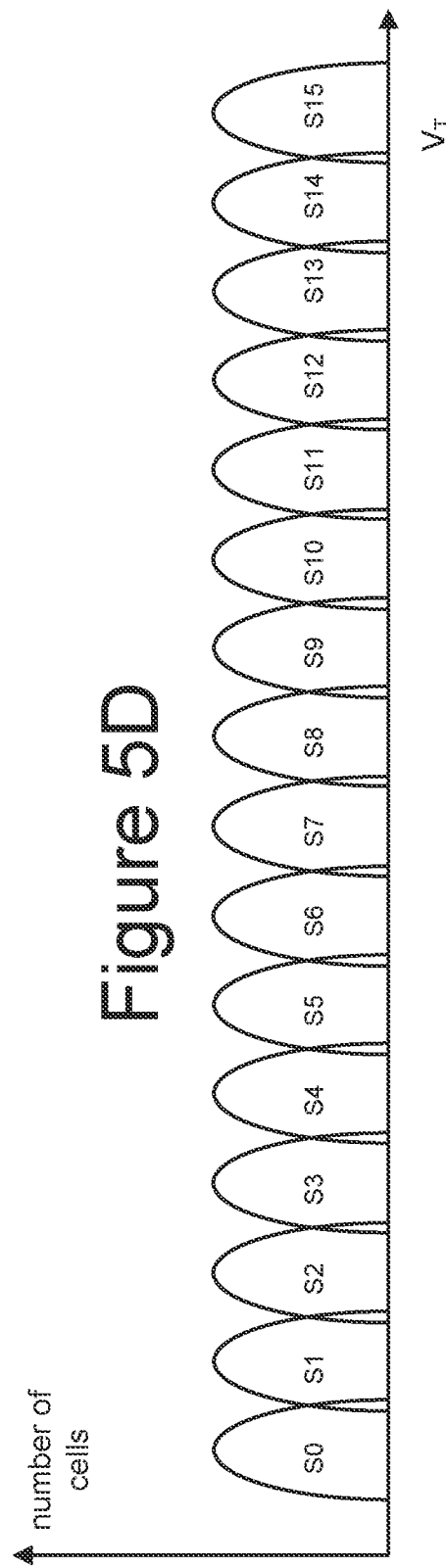
FIG. 5D depicts threshold voltage distributions.
Figure 5E:
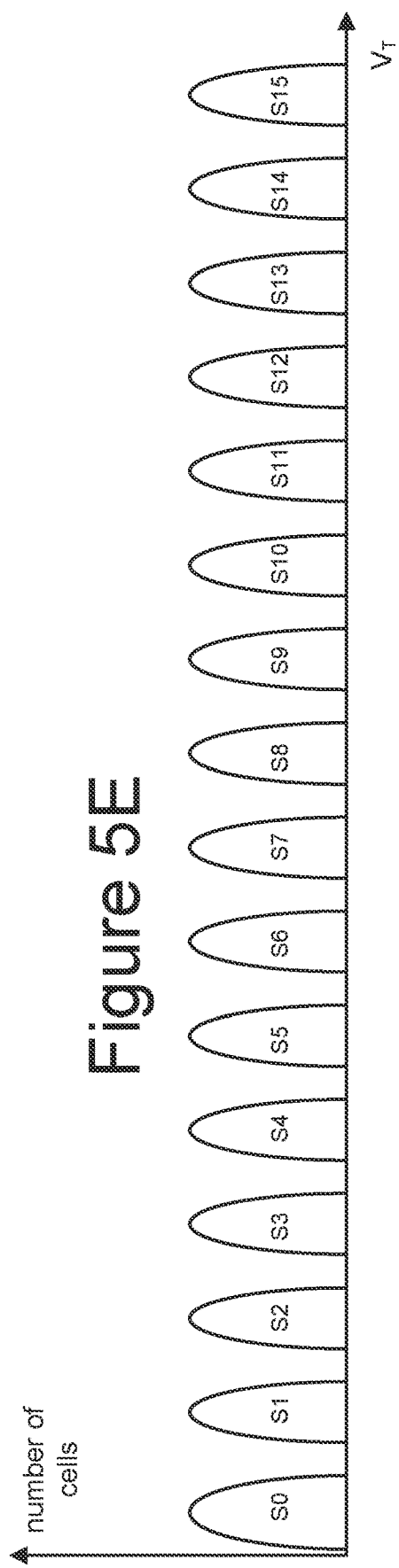
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
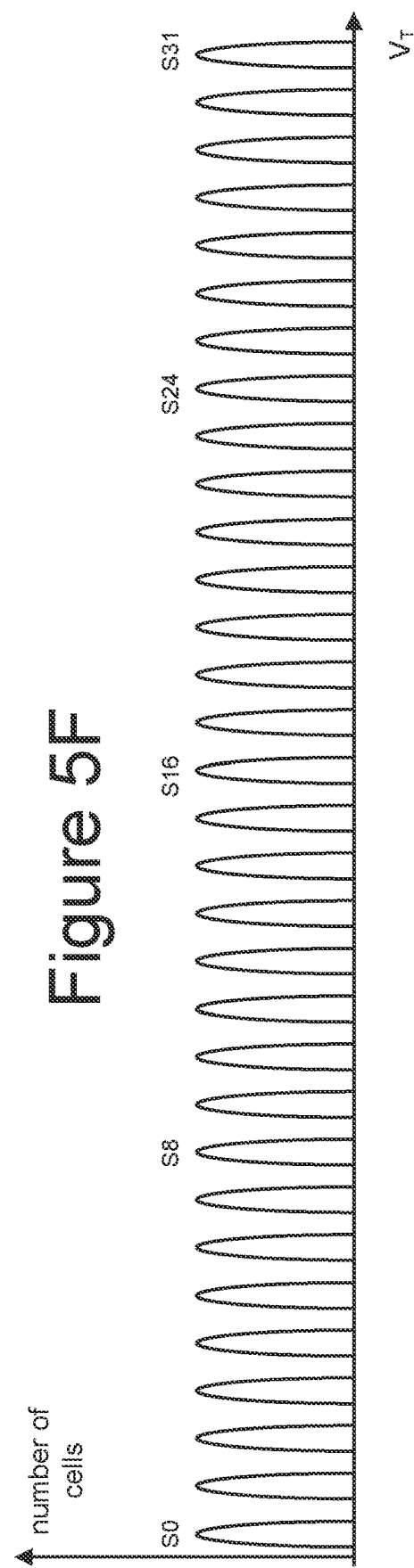
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
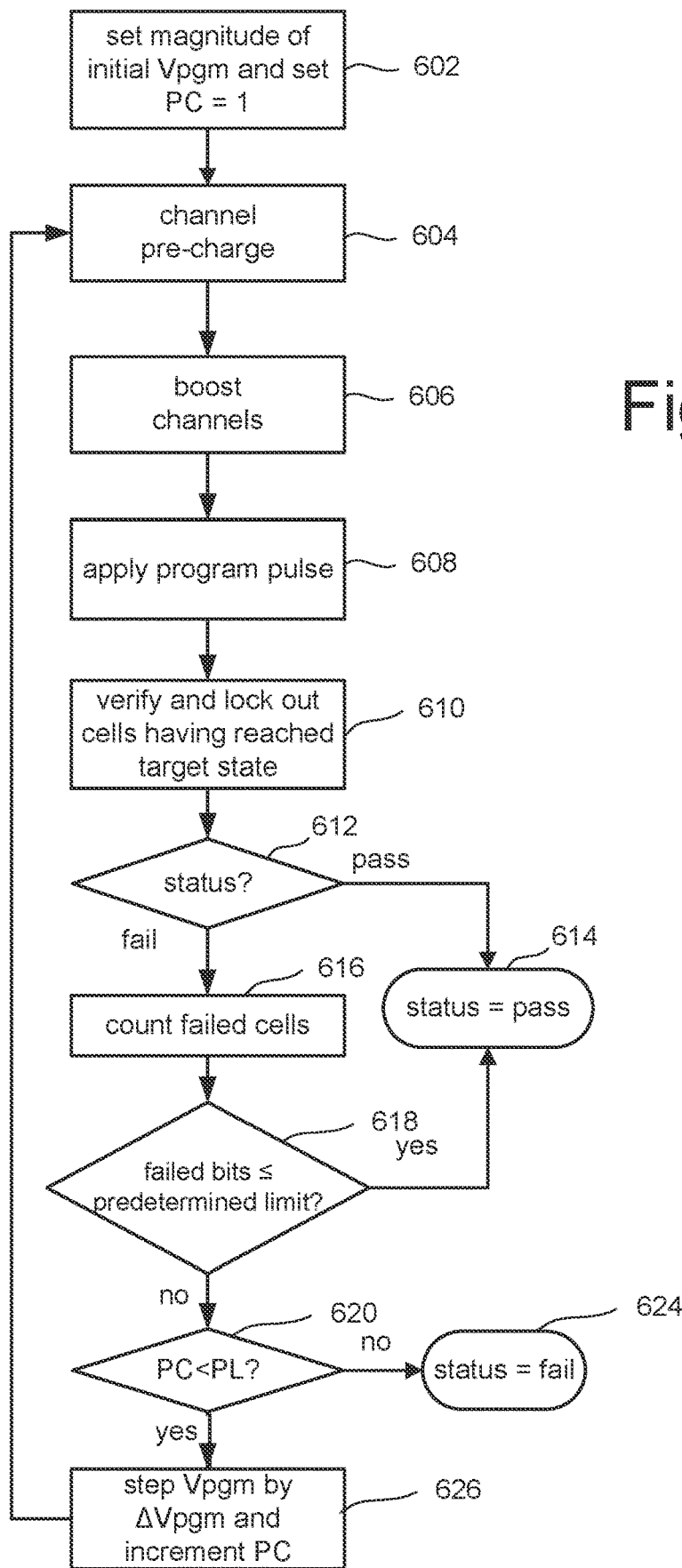
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
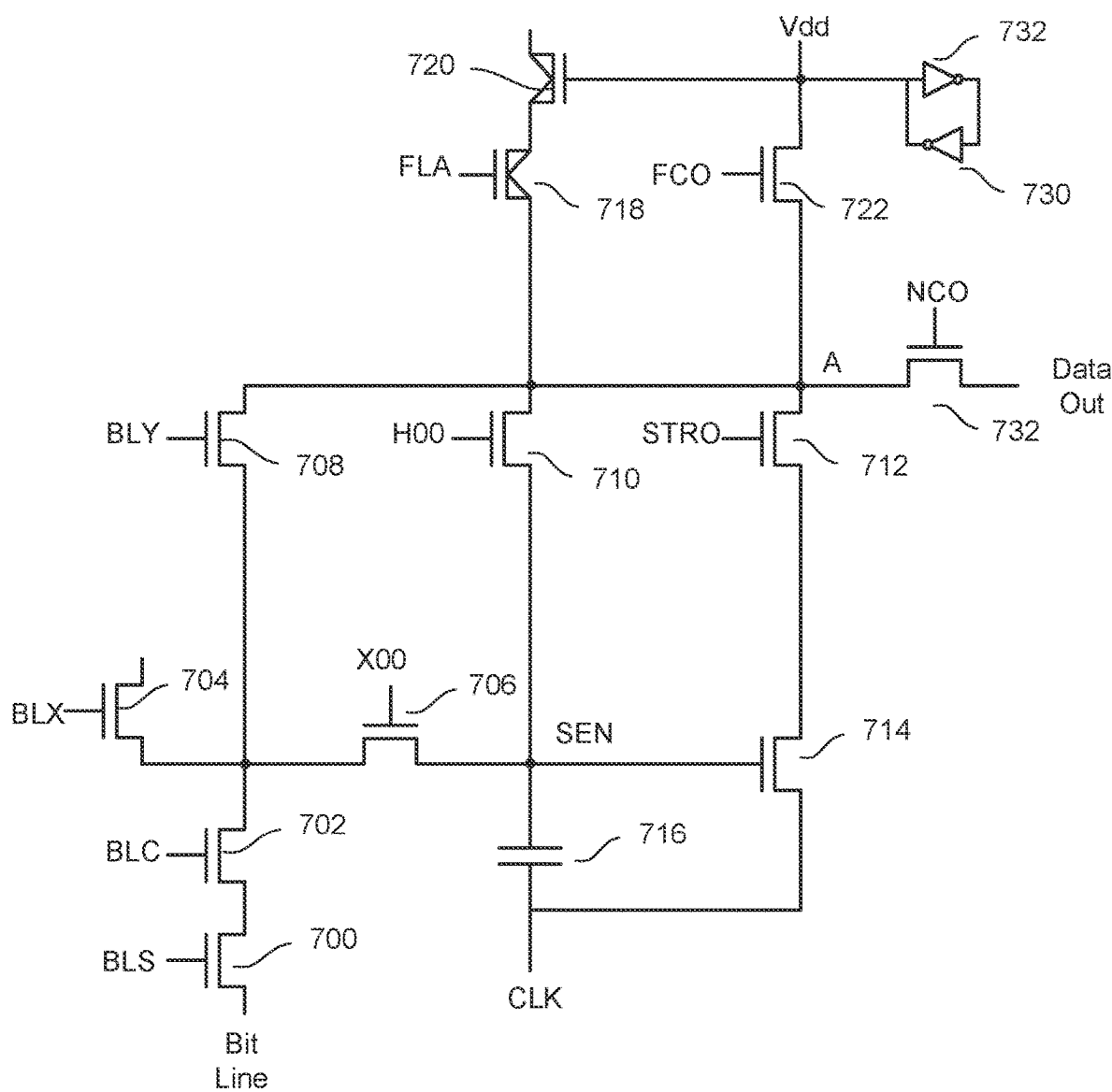
FIG. 7 is a schematic diagram of one embodiment of a sense amplifier.

The processes of reading data includes sensing to determine if a memory cell has a threshold voltage that exceeds a read compare voltage applied to the selected word line. In one embodiment, the sensing is performed by sense amplifiers 230 of column control circuitry 210 (see FIGS. 2A and 2B). FIG. 7 is a schematic diagram depicting one example circuit of a sense amplifier (of sense amplifiers 230 of column control circuitry 210) that is can perform the sensing during a read processes. Other sense amplifier circuits can also be used. As described above and below, the circuit of FIG. 7 will pre-charge a capacitor (or other charge storage device) to a pre-charge magnitude, discharge the capacitor through the memory cell for a sense time, and sense voltage at the capacitor after the sense time. The sensed voltage will be indicative of whether the memory cells conducted the current being sensed for, which is indicative of whether the threshold voltage of the memory cell is greater than or less than the read compare voltage being tested for (corresponding to the control gate voltage).

FIG. 7 shows transistor 700 connected to the Bit Line and transistor 702. Transistor 700 receives the signal BLS at its gate, and is used to connect to or isolate the Bit Line (sometimes called an isolation transistor). Transistor 702 receives the signal BLC at its gate, and is used as a voltage clamp (e.g., voltage clamp transistor). The gate voltage BLC is biased at a constant voltage equal to the desired Bit Line voltage plus the threshold voltage of transistor 702. The function of transistor 702, therefore, is to maintain a constant Bit Line voltage during a sensing operation (during read or verify), even if the current through the Bit Line changes. As described herein, in some embodiments of the disclosed technology, the signal BLC is subject to adjustment in order to vary the bit line voltage as described below. Varying the bit line voltage will result in a corresponding change to the bit line current.

Transistor 702 is connected to transistors 704, 706 and 708. Transistor 706 is connected to capacitor 716 at the node marked SEN. The purpose of transistor 706 is to connect capacitor 716 to the Bit Line and disconnect capacitor 716 from the Bit Line so that capacitor 716 is in selective communication with the Bit Line. In other words, transistor 706 regulates the sense time mentioned above. That is, while transistor 706 is turned on capacitor 716 can discharge through the Bit Line, and when transistor 706 is turned off capacitor 716 cannot discharge through the Bit Line. The gate voltage of transistor 706 is labeled as X00. As described herein, in some embodiments of the disclosed technology, the sense time is subject to adjustment as described below. Changing the sense time can include changing the timing of the signal X00.

The node at which transistor 706 connects to capacitor 716 is also connected to transistor 710 and transistor 714. Transistor 710 is connected to transistors 708, 712 and 718. Transistor 718 is also connected to transistor 720. Transistors 718 and 720 are PMOS transistors while the other transistors of FIG. 7 are NMOS transistors. Transistors 710, 718, and 720 provide a pre-charging path to capacitor 716. A voltage (e.g. Vdd or other voltage) is applied to the source of transistor 720. By appropriately biasing transistors 710, 718 and 720, the voltage applied to the source of transistor 720 can be used to pre-charge capacitor 716. After pre-charging, capacitor 716 can discharge through the Bit Line via transistor 706 (assuming that transistors 700 and 702 are conducting).

The circuit of FIG. 7 includes inverters 730 and 732 forming a latch circuit. The output of inverter 732 is connected to the input of inverter 730 and the output of inverter 730 is connected to the input of inverter 732 as well as transistors 720 and 722. The input of inverter 732 will receive Vdd and the two inverters 730, 732 will act as a latch to store Vdd. The input of inverter 732 can also be connected to another value. Transistors 712 and 722 provide a path for communicating the data stored by inverters 730 and 732 to transistor 714. Transistor 722 receives the signal FCO at its gate. Transistor 712 receives the signal STRO at its gate. By raising or lowering FCO and STRO, a path is provided or cut off between the inverters 730, 732 and transistor (sensing switch) 714. The gate of transistor 714 is connected capacitor 716, transistor 706 and transistor 710 at the node marked SEN. The other end of capacitor 716 is connected to the signal CLK.

As discussed above, capacitor 716 is pre-charged via transistors 710, 718 and 720. This will raise the voltage at the SEN node to a pre-charge voltage level (Vpre). When transistor 706 turns on, capacitor 716 can discharge its charge through the Bit Line and the selected memory cell if the threshold voltage of the memory cell is below the voltage level being tested for. If the capacitor 716 is able to discharge, then the voltage at the capacitor (at the SEN node) will decrease.

The pre-charge voltage (Vpre) at the SEN node is greater than the threshold voltage of transistor 714; therefore, prior to the strobe time, transistor 714 is on (conducting). Since transistor 714 is on during the strobe time, then transistor 712 should be off. If the capacitor does not discharge during the strobe time, then the voltage at the SEN node will remain above the threshold voltage of transistor 714 and the charge at the inverters 730, 732 can be discharged into the CLK signal when STRO turns on transistor 712. If the capacitor discharges sufficiently during the strobe time, then the voltage at the SEN node will decrease below the threshold voltage of transistor 714; thereby, turning off transistor 714 and the data (e.g., Vdd) stored at inverters 730, 732 from being discharged through CLK. So testing whether the diodes 730, 732 maintain their charge or discharge will indicate the result of the verification process. In one embodiment, the result can be read at node A via transistor 734 (Data Out) by turning on transistor 734 gate signal NCO.

The pre-charge level of capacitor 716 (and, thus, the pre-charge voltage at node SEN) is limited by the current passing through transistor 710. The current that passes through transistor 710 is limited by the gate voltage H00. As such, the pre-charge voltage at node SEN is limited by the voltage H00 less the threshold voltage of transistor 710. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read/verify operation, the voltage applied to the control gate of the memory cell may cause the channel (connected to the bit line) of the cell to conduct. If this happens, a capacitor is discharged through the channel, lowering in voltage as it discharges.

Figure 8:
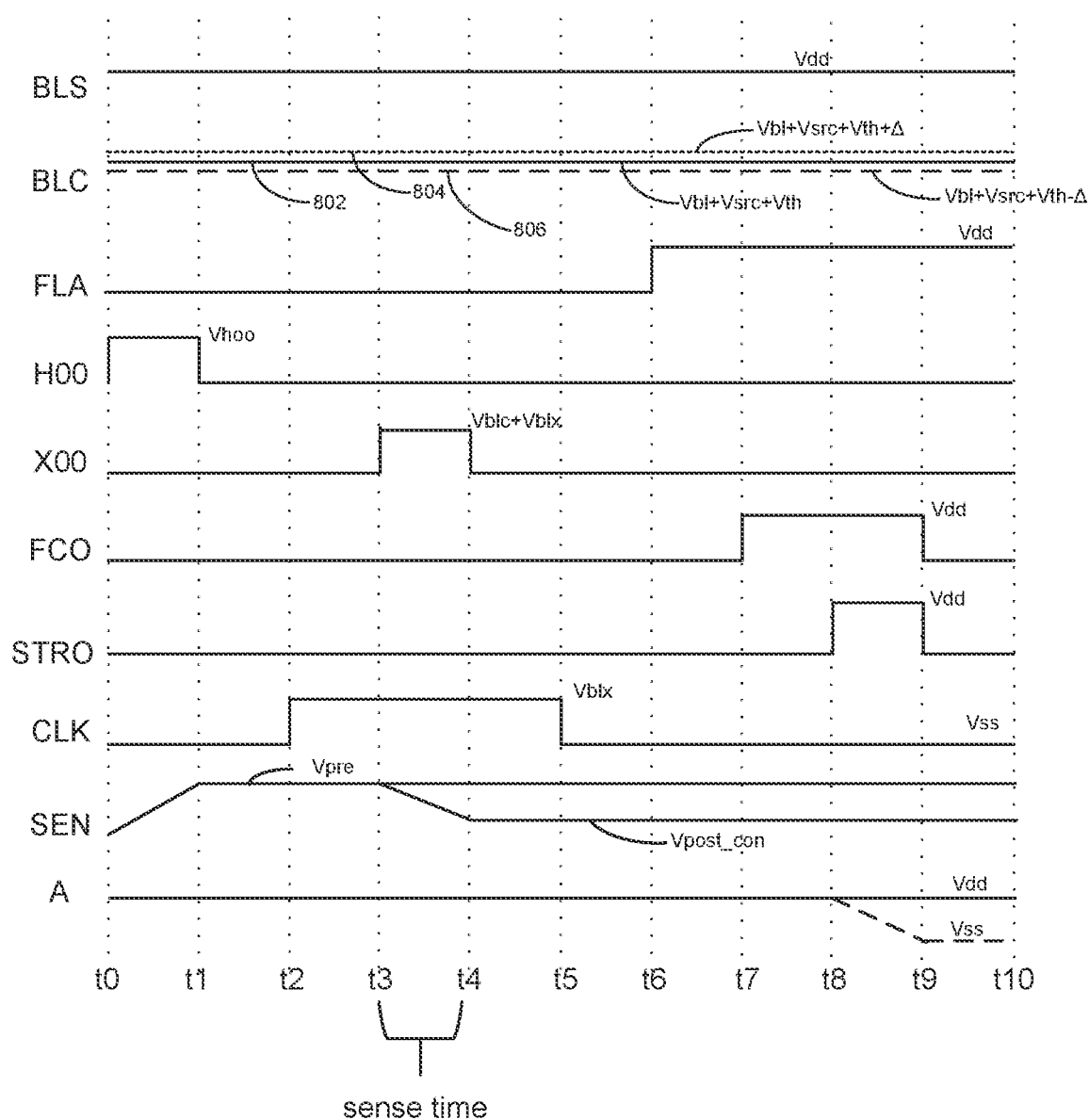
FIG. 8 is a timing diagram depicting example sense (read) operation of the sense amplifier of FIG. 7.

FIG. 8 is a timing diagram describing the behavior of various signals from FIG. 7 during a sensing operation (e.g., for reading or verifying). The signal BLS is at Vdd the entire time depicted. The nominal or default signal BLC (solid line 802) is at Vbl+Vsrc+Vth, where Vbl is the voltage of the Bit, Vsrc is the voltage of the source line and Vth is the threshold voltage of transistor 702. As discussed below, one example of differential temperature compensation includes adjusting the bit line voltage, for example, by adding A (see dotted line 804) or by subtracting A (see dashed line 806). Other adjustments can also be made. More details are provided below. One example of a nominal BLC voltage is 0.25 volts. Examples of adjustments to BLC (to adjust the read process) range between 6 millivolts and 170 millivolts. Adjusting the gate voltages applied to the bit line clamp transistors 702 results in corresponding changes to the bit line voltages.

The signal FLA starts at Vss at t0 and goes to Vdd at t6. When the signal FLA is at Vss, the pre-charging path is regulated by transistor 710. At to, the voltage of H00 is raised from ground to a pre-charge level. The raising of the voltage at H00 turns on transistor 710 and opens up the pre-charge path. The magnitude of the voltage at H00 is set. FIG. 8 shows H00 going to Vhoo. Note that in some embodiments, the circuit of FIG. 7 can respond to more than one voltage magnitude for H00. For example, in one embodiment, the output of the circuit of FIG. 7 is a linear function with respect to position of the memory cell being sensed so that there are many different possible voltage magnitudes for H00, depending on position of the memory cell being sensed. The signal H00 will stay at the pre-charge voltage (Vhoo) until time t1. While H00 is high, transistor 710 turns on and capacitor 716 will pre-charge between t0 and t1, as depicted by the voltage at SEN (depicted second from the bottom on FIG. 8). At time t1, H00 is brought down to Vss and the pre-charging is completed.

The signal X00 is used to allow capacitor 716 to be in communication with the Bit Line so that the capacitor can discharge through the Bit Line and the selected memory cell. At time t3, X00 is raised to Vblc+Vblx, where Vblx is the voltage of the signal BLX (both discussed above). At time t4, the voltage at X00 is lowered to Vss. Between times t3 and t4, known as the sense time, capacitor 716 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 2516. As will be discussed in more detail below, one example of differential temperature compensation includes adjusting the sense time, for example, by increasing or decreasing the time period between t3 and t4 by changing the timing for lowering the voltage of the signal X00 (gate voltage of transistor 706).

As discussed above, because H00 is raised between t0 and t1, capacitor 716 (and SEN node) will charge up between t0 and t1 (the pre-charge). This is depicted in FIG. 8 with the SEN node charging from Vss to Vpre. The solid line for Vpre represents an example pre-charging of the node SEN (and capacitor 716) in response to Vh00 being applied to the gate of transistor 710.

When X00 is raised up at t3, capacitor 716 can initially pre-charge the bit line and then discharge through the Bit Line (if the threshold voltage is at the appropriate level). As depicted in FIG. 8 between t3 and t4, the voltage at the SEN node can dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 716 will not discharge and the voltage will remain at Vpre. The period between t3 and t4 is the sense time time and can be adjusted, as described above.

FIG. 8 shows that the signal FCO is raised to Vdd at t7 and lowered to Vss at t9. The signal STRO is raised to Vdd at t8 and lowered at t9. Between times t8 and t9, there is a path between the inverters 730, 732 and transistor 714. If the voltage at the node SEN is greater than the threshold voltage of transistor 714, then there will be a path from the inverters 730, 732 to CLK and the data at the inverters 730,732 will dissipate through the signal CLK and through the transistor 714. If the voltage at the node SEN is lower than threshold voltage of transistor 714 (e.g. if the capacitor discharged), then transistor 714 will turn off and the voltage stored by the inverters 730, 732 will not dissipate into CLK. FIG. 8 shows the voltage level at node A at Vdd. If the voltage of the capacitor does not dissipate (e.g., due to not enough current flowing because the threshold voltage of the selected memory cell is greater than the voltage being tested for), then transistor 714 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 714 will turn off and the voltage at node A will remain at Vdd (as depicted by the solid line). The output of node A is provided to the Data Out signal via transistor 734 by applying Vdd to the signal NCO.

It has been observed that the operation and behavior of integrated circuits, including non-volatile storage systems implemented on an integrated circuit, can be effected by temperature. For example, sensing operations at higher temperatures observe higher currents than sensing operations for the same memory cell at lower temperatures. This can sometimes lead to errors when the sensing for a verify operation is performed at a different temperature then the sensing of the same data for a read operation. Therefore, it is proposed to provide temperature compensation based on a difference between temperature at the time data is programmed to non-volatile memory cells and temperature at the time the same data is read from the same non-volatile memory cells.

For example, if data is being read at a significantly lower temperature than the temperature that the data was programmed at, the read process will sense a lower current through the selected memory cell for the same data, which makes it appear that the threshold voltage of the selected memory cell is higher than programmed. To minimize the discrepancy between verify and read processes, it is desired to increase the current through the selected memory cell during the read process in order to lower the apparent sensed threshold voltage of the selected memory cell. Examples of means to increase the current through the selected memory cell include (but are not limited to) increasing the bit line voltage or increasing the sense time. One embodiment for increasing the bit line voltage is to increase the signal BLC, which is the gate voltage to transistor 702 of the sense amplifier of FIG. 7 (see dotted line 804 of FIG. 8). One embodiment for increasing the sense time is to increase the time between t3 and t4 of the signal diagram depicted in FIG. 8 by changing the timing for lowering the voltage of the signal X00 (gate voltage of transistor 706—see FIG. 7).

If data is being read at a significantly higher temperature than the temperature that the data was programmed at, the read process will sense a higher current through the selected memory cell for the same data, which makes it appear that the threshold voltage of the selected memory cell is lower than programmed. To minimize the discrepancy between verify and read processes, it is desired to decrease the current through the selected memory cell during the read process in order to raise the apparent sensed threshold voltage of the selected memory cell. Examples of means to decrease the current through the selected memory cell include (but are not limited to) decreasing the bit line voltage or decreasing the sense time. One embodiment for decreasing the bit line voltage is to decrease the signal BLC, which is the gate voltage to transistor 702 of the sense amplifier of FIG. 7 (see dashed line 806 of FIG. 8). One embodiment for decreasing the sense time is to decrease the time between t3 and t4 of the signal diagram depicted in FIG. 8 by changing the timing for lowering the voltage of the signal X00 (gate voltage of transistor 706—see FIG. 7).

Figure 9:
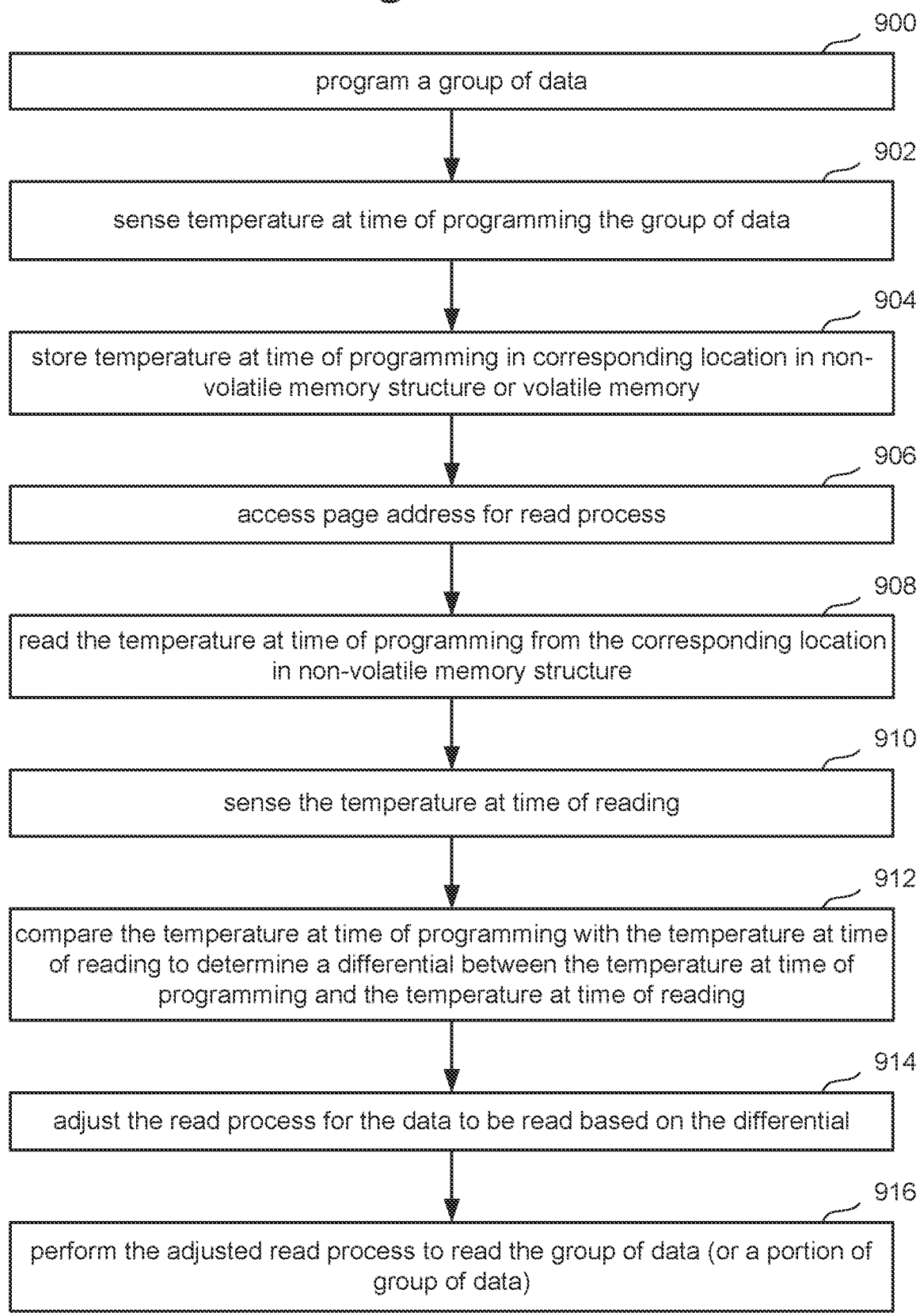
FIG. 9 is a flow chart describing one embodiment of a process for programming and reading data with differential temperature compensation.

FIG. 9 is a flow chart describing one embodiment of a process for programming and reading data with differential temperature compensation. In one example embodiment, the process of FIG. 9 is performed by any of the embodiments of a control circuit discussed above. In one example embodiment, the process of FIG. 9 is performed by integrated memory assembly 207 using any of the embodiments of a control circuit discussed above of control die 211 to program memory cells (e.g., NAND strings of memory structure 202) on memory die 201. In one embodiment, the process of FIG. 9 is performed at the direction of state machine 262 (or another processor). In another embodiment, the process of FIG. 9 is performed at the direction of memory controller 120. The control circuit is connected to the memory cells in one or more memory dies (e.g., via control lines such as word lines, bit lines, source line and select lines), as described above with respect to FIGS. 1-4J.

In step 900 of FIG. 9, the control circuit programs a group of data. For example, the process of FIG. 6 can be used one or more times to implement the programming schemes of any of FIGS. 5A-F to program host data to one or more pages of one or more blocks of non-volatile memory cells of memory structure 202. In step 904, the control circuit senses temperature at time of programming the group of data. The sensing of temperature can be performed at the memory controller 120 using temperature sensor 165, can be performed at the memory die 200 using temperature sensor 261, or can be performed at the control die 211 of an integrated memory assembly 207 using temperature sensor 261. Step 902 can be performed after step 900, before step 900 or concurrently with step 900. In step 904, the control circuit stores the temperature at time of programming that was sensed in step 902. In one embodiment, the temperature at time of programming is stored in non-volatile memory structure 202. In another embodiment, the temperature at time of programming is stored in volatile memory 140 (or another volatile memory, such as a DRAM on the memory die 200/201 or control die 211). In one embodiment, the data storage configured to store the temperature values (e.g., non-volatile memory or volatile memory) includes a data structure that has a record corresponding to each page, set of pages, block, set of blocks or other groupings of data. Thus, each grouping of data corresponds to a location in the data structure. For example, the temperature at time of programming data into the Nth set of pages is stored in the Nth record of data structure 202t of memory structure/array 202. In one embodiment, the temperature at time of programming is stored in the volatile memory or in the non-volatile memory as a two byte temperature code. In another embodiment, the temperature at time of programming can be stored in the same block as the data being programmed, as regular data, metadata or header information.

Steps 900-904 pertain to programming and steps 906-916 pertain to reading. Thus, steps 906-916 may be performed immediately after step 904 or, as is likely, an unplanned amount of time will elapse between steps 904 and 906.

In step 906, the control circuit accesses an address (e.g., page address) for a read process. In one embodiment, step 906 is performed by the control circuit in response to receiving a request to read data at a page address. In another embodiment, the address can be for a unit of data other than a page. In one embodiment, a page is the unit of programming (e.g., the amount of data programmed at a same time). In step 908, the address accessed in step 906 is used to access the location in the data storage that is storing the temperature at time of programming for the data address accessed in step 906. In step 910, the control circuit senses the temperature at time of reading (e.g., uses temperature sensor 165 or temperature sensor 261 to determine the current temperature at the memory). In step 912, the control circuit compares the temperature at time of programming (step 902) with the temperature at time of reading (step 908) to determine a differential between the temperature at time of programming and the temperature at time of reading. The differential can include an indication of which temperature is higher/lower and/or the difference in magnitude between the two temperatures. In step 914, the control circuit adjusts the read process for the data to be read based on the differential determined in step 912. In general, a read process has multiple configuration parameters that control operation of the read process. Step 914 includes adjusting one or more of those parameters. Examples of the parameters includes bit line voltage, sense time, read compare voltage, pre-charge magnitude, etc. In many cases, adjusting the read process comprises adjusting the sense amplifier (e.g., see FIG. 7), such as adjusting the timing and/or magnitude of one or more of the signals depicted in FIG. 8. In step 916, the control circuit performs the adjusted read process (e.g., adjusted as per step 914) in order to read the group of data (or a portion of group of data) programmed in step 900, which corresponds to the address accessed in step 906. Note that steps 906-916 can be performed in other orders than as depicted in FIG. 9.

Figure 10:
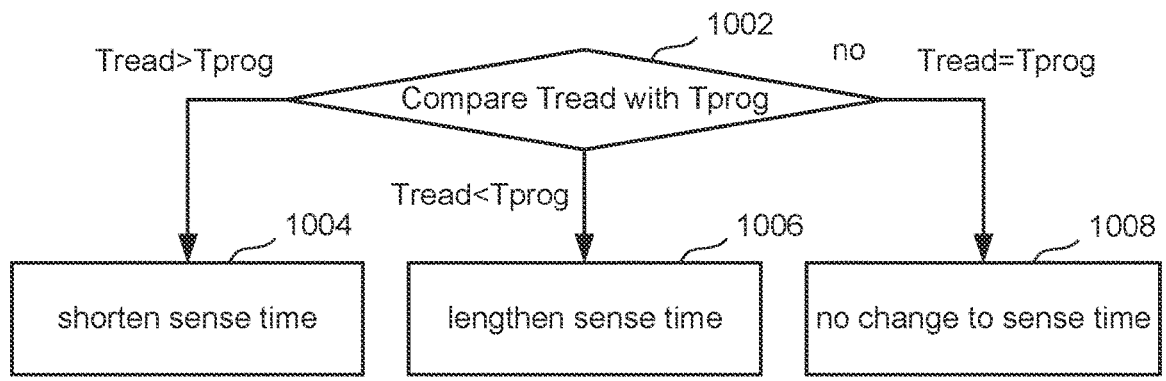
FIG. 10 is a flow chart describing one embodiment of a method for adjusting a read process based on the differential between the temperature at time of programming and temperature at time of reading.

FIG. 10 is a flow chart describing one embodiment of a method for adjusting a read process based on the differential between the temperature at time of programming and temperature at time of reading. In one embodiment, the process of FIG. 10 is an example implementation of steps 912 and 914 of FIG. 9. In one example embodiment, the process of FIG. 10 is performed by any of the embodiments of a control circuit discussed above. In one example embodiment, the process of FIG. 10 is performed by integrated memory assembly 207 using any of the embodiments of a control circuit discussed above of control die 211 to program memory cells (e.g., NAND strings of memory structure 202) on memory die 201. In one embodiment, the process of FIG. 10 is performed at the direction of state machine 262 (or another processor). In another embodiment, the process of FIG. 10 is performed at the direction of memory controller 120. The control circuit is connected to the memory cells in one or more memory dies (e.g., via control lines such as word lines, bit lines, source line and select lines), as described above with respect to FIGS. 1-4J.

In step 1002 of FIG. 10, the control circuit compares the temperature at time of programming (Tprog) with the temperature at time of reading (Tread) to determine a differential between the temperature at time of programming and the temperature at time of reading. The differential can include an indication of which temperature is higher/lower and/or the difference in magnitude between the two temperatures. If the temperature at time of reading is greater than the temperature at time of programming, then in step 1004 the sense time is shortened. In one embodiment, the shortening of the sense time is by a same predetermined amount regardless of the difference between the temperature at time of reading and the temperature at time of programming. In another embodiment, the amount that the sense time is shortened is proportional to (or otherwise based on) the magnitude of the difference between the temperature at time of reading and the temperature at time of programming. In another embodiment, the amount that the sense time is shortened is based only on the temperature at time of reading.

If the temperature at time of reading is less than the temperature at time of programming, then in step 1006 the sense time is lengthened. In one embodiment, the lengthening of the sense time is by a same predetermined amount regardless of the difference between the temperature at time of reading and the temperature at time of programming. In another embodiment, the amount that the sense time is short lengthened is proportional to (or otherwise based on) the magnitude of the difference between the temperature at time of reading and the temperature at time of programming. In another embodiment, the amount that the sense time is lengthened is based only on the temperature at time of reading. If the temperature at time of reading is equal to the temperature at time of programming, then in step 1008 no change is made to the sense time.

Figure 11:
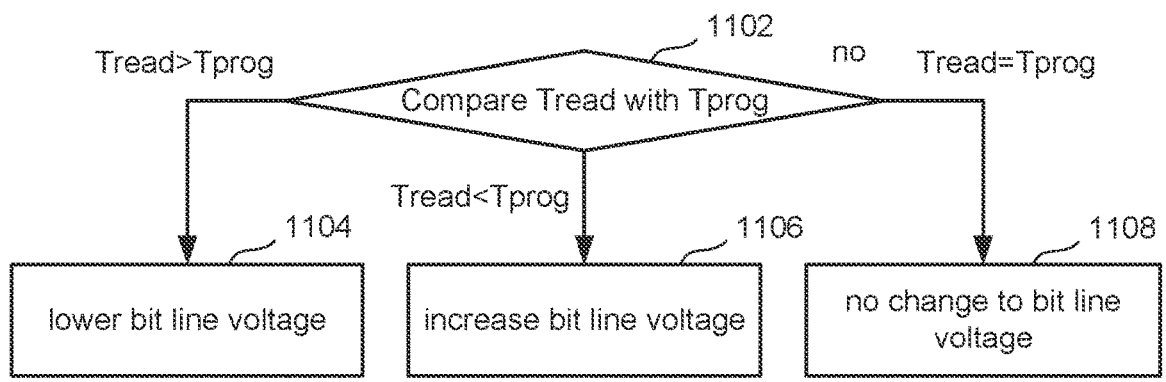
FIG. 11 is a flow chart describing one embodiment of a method for adjusting a read process based on the differential between the temperature at time of programming and temperature at time of reading.

FIG. 11 is a flow chart describing another embodiment of a method for adjusting a read process based on the differential between the temperature at time of programming and temperature at time of reading. In one embodiment, the process of FIG. 11 is an example implementation of steps 912 and 914 of FIG. 9. In one example embodiment, the process of FIG. 11 is performed by any of the embodiments of a control circuit discussed above. In one example embodiment, the process of FIG. 11 is performed by integrated memory assembly 207 using any of the embodiments of a control circuit discussed above of control die 211 to program memory cells (e.g., NAND strings of memory structure 202) on memory die 201. In one embodiment, the process of FIG. 11 is performed at the direction of state machine 262 (or another processor). In another embodiment, the process of FIG. 11 is performed at the direction of memory controller 120. The control circuit is connected to the memory cells in one or more memory dies (e.g., via control lines such as word lines, bit lines, source line and select lines), as described above with respect to FIGS. 1-4J.

In step 1102 of FIG. 11, the control circuit compares the temperature at time of programming (Tprog) with the temperature at time of reading (Tread) to determine a differential between the temperature at time of programming and the temperature at time of reading. The differential can include an indication of which temperature is higher/lower and/or the difference in magnitude between the two temperatures. If the temperature at time of reading is greater than the temperature at time of programming, then in step 1104 the bit line voltage is lowered (e.g., lower BLC). In one embodiment, the lowering of the bit line voltage is by a same predetermined amount regardless of the difference between the temperature at time of reading and the temperature at time of programming. In another embodiment, the amount that the bit line voltage is lowered is proportional to (or otherwise based on) the magnitude of the difference between the temperature at time of reading and the temperature at time of programming. In another embodiment, the amount that the bit line voltage is lowered is based only on the temperature at time of reading.

If the temperature at time of reading is less than the temperature at time of programming, then in step 1106 the bit line voltage is increased. In one embodiment, the increasing of the bit line voltage is by a same predetermined amount regardless of the difference between the temperature at time of reading and the temperature at time of programming. In another embodiment, the amount that the bit line voltage is increased is proportional to (or otherwise based on) the magnitude of the difference between the temperature at time of reading and the temperature at time of programming. In another embodiment, the amount that the bit line voltage is increased is based only on the temperature at time of reading. If the temperature at time of reading is equal to the temperature at time of programming, then in step 1108 no change is made to the bit line voltage. The flow charts of FIGS. 10 and 11 are examples of adjusting the sense amplifiers (e.g., adjusting control of the sense amplifiers by changing the voltage at BLC or sense time) for a read process based on the differential between the temperature at time of programming and temperature at time of reading.

Figure 12:
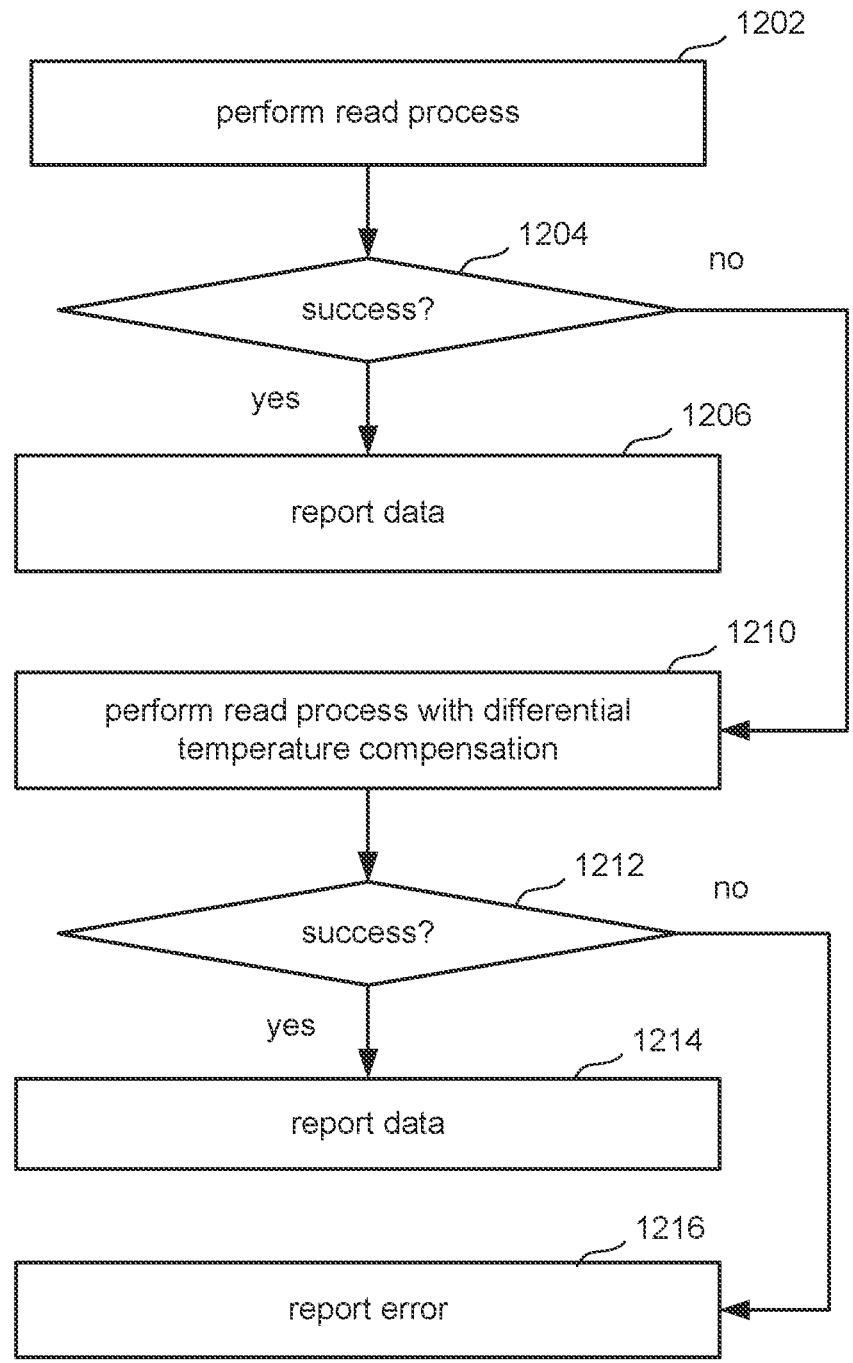
FIG. 12 is a flow chart describing one embodiment of a process for reading data.

Looking back at FIG. 9, step 916 includes performing the adjusted read process. In some embodiments, the control circuit will perform the adjusted read process without first trying to read the data using a standard (e.g., unadjusted) read process. For example, if the data has been stored for a very long period of time then the control circuit will perform the adjusted read process without first trying to read the data using the standard (e.g., unadjusted) read process. In other embodiments, the control circuit will first try to read the data without adjusting the read process (e.g., without providing differential temperature compensation) and only perform the adjusted read process (e.g., with differential temperature compensation) if the unadjusted read process fails. FIG. 12 is a flow chart describing one embodiment of a process for reading data that first tries to read the data without adjusting the read process (e.g., without providing differential temperature compensation) and only performs the adjusted read process (e.g., with differential temperature compensation) if the unadjusted read process fails.

In one example embodiment, the process of FIG. 12 is performed by any of the embodiments of a control circuit discussed above. In one example embodiment, the process of FIG. 12 is performed by integrated memory assembly 207 using any of the embodiments of a control circuit discussed above of control die 211 to program memory cells (e.g., NAND strings of memory structure 202) on memory die 201. In one embodiment, the process of FIG. 12 is performed at the direction of state machine 262 (or another processor). In another embodiment, the process of FIG. 12 is performed at the direction of memory controller 120. The control circuit is connected to the memory cells in one or more memory dies (e.g., via control lines such as word lines, bit lines, source line and select lines), as described above with respect to FIGS. 1-4J.

In step 1202, the control circuit performs a standard read process known in the art. If the read process was successful (step 1204), then the data is reported in step 1206 (e.g., data is reported to the host). If the read process was not successful (step 1204), then the control circuit performs a read process using differential temperature compensation. If the read process of step 1210 was successful (step 1212), then the data is reported in step 1214 (e.g., data is reported to the host). If the read process of step 1210 was not successful (step 1212), the control circuit reports an error (e.g., reports the error to the host). In one embodiment, the process of FIG. 9 can be performed as part of the process of FIG. 12 such that steps 1202 and 1204 are performed prior to step 906 of FIG. 9 and step 1210 of FIG. 12 includes performing steps 906-916 of FIG. 9.

Differential temperature compensation is useful for bulk programming/reading (e.g., many pages of data) or programming/reading super pages of data (multiple pages residing on different die). FIG. 13 is a flow chart describing one embodiment of a process for programming and reading data with differential temperature compensation for bulk programming/reading. In one example embodiment, the process of FIG. 13 is performed by any of the embodiments of a control circuit discussed above. In one example embodiment, the process of FIG. 13 is performed by integrated memory assembly 207 using any of the embodiments of a control circuit discussed above of control die 211 to program memory cells (e.g., NAND strings of memory structure 202) on memory die 201. In one embodiment, the process of FIG. 13 is performed at the direction of state machine 262 (or another processor). In another embodiment, the process of FIG. 13 is performed at the direction of memory controller 120. The control circuit is connected to the memory cells in one or more memory dies (e.g., via control lines such as word lines, bit lines, source line and select lines), as described above with respect to FIGS. 1-4J.

In one set of embodiments, bulk programming is defined as programming at least X amount of data. For example, bulk programming can be defined as programming M pages of data, where M=100 pages, 150 pages, 200 pages, etc. Bulk programming can also be defined as programming B blocks of data, where B=1, 2, 3, etc. The minimum amount of data needed to be considered bulk programming is referred to as a complete group of data; for example, if bulk programming is defined as programming 100 pages of data then a complete group of data is 100 pages of data and a partial group of data is less than 100 pages of data. In some embodiments of bulk programming, the data needs to be programmed as groups of data; for example, 250 pages of data would be programmed as a first complete group of data (pages 0-99), a second complete group of data (pages 100-199) and a partial group of data (pages 200-249).

In step 1302 of FIG. 13, the control circuit program sand reads with differential temperature compensation based on a differential between temperature at time of programming and temperature at time of reading for data programmed as a complete group of data. For example, if the control circuit is programming a complete group of data (e.g., 100 pages as per the example above), then in step 1302 the programming of that complete group of data and the subsequent reading of all or a portion of that complete group of data comprises performing the process of FIG. 9 (including the processes of FIGS. 10 and/or 11) or the process of FIG. 12 in combination with (as discussed above) the process of FIG. 9 (including the processes of FIGS. 10 and/or 11).

In one embodiment, non-volatile memory structure 202 (or a volatile memory, as described above) is configured to store the temperature values in a data structure that has a record corresponding to each complete group of data. Using the example above in which a complete group of data is 100 pages of data, then the data structure includes a two byte record for each 100 pages of data. Each two byte record stores a two byte temperature code representing the temperature at time of programming. In one embodiment of step 1302, the control circuit stores one two byte temperature code (representing the temperature at time of programming) for each 100 pages of data programmed. In one embodiment, the temperature code is stored as single bit per memory cell (see FIG. 5A) while the corresponding 100 pages of host data are stored as multiple bits per memory cell (see FIGS. 5B-F). Thus, in one set of embodiments, each grouping of data corresponds to a location in the data structure. For example, the temperature at time of programming data into the Nth set of pages is stored in the Nth record of data structure 202*t* of memory structure/array 202. In another embodiment, the temperature at time of programming can be stored in the same block as the data being programmed, as regular data, metadata or header information. In some implementations, the date and time of day is stored with the two byte temperature code.

In step 1304, the control circuit programs and reads without differential temperature compensation based on a differential between temperature at time of programming and temperature at time of reading for data programmed as a partial group of data. In one embodiment, when programming the partial group of data, no temperature at time of programming is stored. In one embodiment in which there is the data structure discussed above that has a record corresponding to each complete group of data, when programming the partial group of data nothing will be stored in the corresponding record in the data structure or a flag will be stored in the corresponding record in the data structure, where the flag is a two byte value that indicates that no valid temperature is stored therein.

In one embodiment, when the system receives a set of data to be programmed, the system will break up the data into complete groups of data and one remaining partial group of data. For example, 250 pages of data would be programmed as a first complete group of data (pages 0-99) using the process of step 1302, a second complete group of data (pages 100-199) using the process of step 1302, and a partial group of data (pages 200-249) using the process of step 1304. When a read request is received, the control circuit will use the address of the data to be read in order to access the corresponding record in the data structure. If the corresponding record in the data structure indicates a valid temperature then the data is read using the process of step 1302 (using differential temperature compensation—see process of FIG. 9) and if the corresponding record in the data structure indicates that no valid temperature is stored therein then the data is read using the process of step 1304 (no differential temperature compensation). In some cases, temperature compensation of step 1304 is based on a differential between temperature of read and a constant, which is backward compatible with the conventional methods.

FIG. 14 is a flow chart describing one embodiment of a process for programming and reading data without using differential temperature compensation. The process of FIG. 14 is one example implementation of step 1304 of FIG. 13. In one example embodiment, the process of FIG. 14 is performed by any of the embodiments of a control circuit discussed above. In one example embodiment, the process of FIG. 14 is performed by integrated memory assembly 207 using any of the embodiments of a control circuit discussed above of control die 211 to program memory cells (e.g., NAND strings of memory structure 202) on memory die 201. In one embodiment, the process of FIG. 14 is performed at the direction of state machine 262 (or another processor). In another embodiment, the process of FIG. 14 is performed at the direction of memory controller 120. The control circuit is connected to the memory cells in one or more memory dies (e.g., via control lines such as word lines, bit lines, source line and select lines), as described above with respect to FIGS. 1-4J.

In step 1402 of FIG. 14, the control circuit programs a group of data. In step 1404, the control circuits determines that less than complete group of data was programmed (e.g., partial group of data was programmed). In step 1406, in response to the programming of step 1402 and determination of step 1404, the control circuit stores a flag in a location in the data storage corresponding to the partial group of data, where the flag is a two byte code indicating that no valid temperature is stored therein. Steps 1402-1406 pertain to programming and steps 1408-1414 pertain to reading. Steps 1408-1414 may be performed immediately after step 1406 or, as is likely, an unplanned amount of time will elapse between steps 1406 and 1408.

In step 1408, the control circuit accesses an address (e.g., page address) for a read process. In one embodiment, step 1408 is performed by the control circuit in response to receiving a request to read data at a page address. In another embodiment, the address can be for a unit of data other than a page. In step 1410, the address accessed in step 1408 is used to read the temperature at time of programming corresponding to the address accessed in step 1408. That is, the control circuit attempts to read the temperature at time of programming from the corresponding location in non-volatile memory structure, but the flag is read instead as the flag is stored in the corresponding location in the data storage of the non-volatile memory structure. In response to the flag (step 1412), the control circuit skips the sensing, storing and/or using the current temperature (the temperature at time of reading). Also in response to the flag (step 1414), the control circuit performs the read process for the partial group of data without an adjustment based on differential between temperature at time of programming and temperature at time of reading. That is, a standard read process known in the art is used to read the partial group of data. Note that in some cases, the read process of step 1414 may include an adjustment based on current temperature (which is different than an adjustment based on a differential between temperature at time of programming and temperature at time of reading). In some cases, temperature compensation of step 1304 is based on a differential between temperature of read and a constant, which is backward compatible with the conventional methods.

Figure 15:
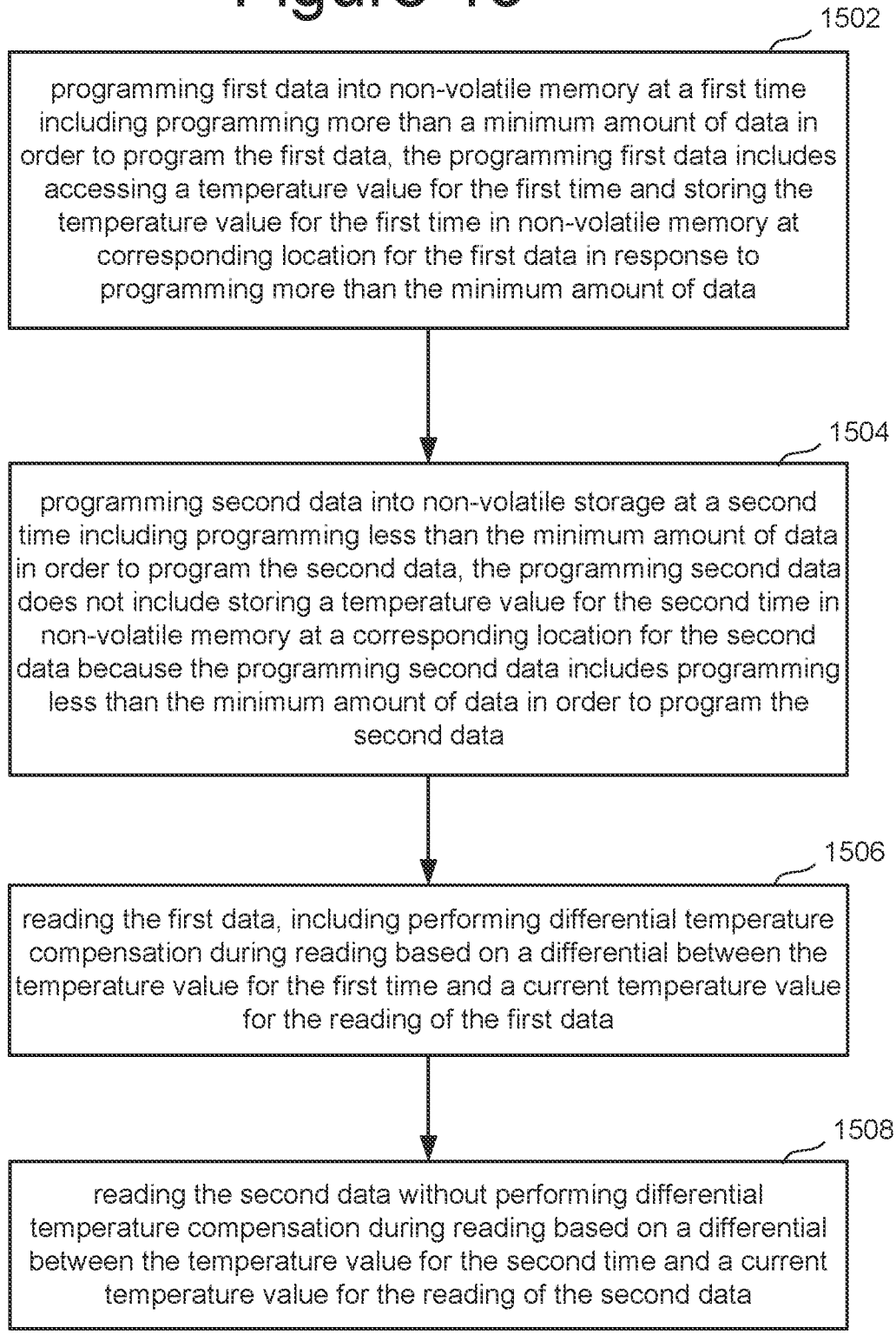
FIG. 15 is a flow chart describing one embodiment of a process for programming and reading data with differential temperature compensation.

FIG. 15 is a flow chart describing one embodiment of a process for programming and reading data with differential temperature compensation for bulk programming. The process of FIG. 15 is one example implementation of the process of FIG. 13. In one example embodiment, the process of FIG. 15 is performed by any of the embodiments of a control circuit discussed above. In one example embodiment, the process of FIG. 15 is performed by integrated memory assembly 207 using any of the embodiments of a control circuit discussed above of control die 211 to program memory cells (e.g., NAND strings of memory structure 202) on memory die 201. In one embodiment, the process of FIG. 15 is performed at the direction of state machine 262 (or another processor). In another embodiment, the process of FIG. 15 is performed at the direction of memory controller 120. The control circuit is connected to the memory cells in one or more memory dies (e.g., via control lines such as word lines, bit lines, source line and select lines), as described above with respect to FIGS. 1-4J.

In step 1502 of FIG. 15, the control circuit programs first data into non-volatile memory at a first time including programming more than a minimum amount of data in order to program the first data. For example, the minimum amount is a complete group of data. The programming the first data includes accessing a temperature value for the first time and storing the temperature value for the first time in non-volatile memory (e.g., temperature data 202*t*) at a corresponding location for the first data in response to programming more than the minimum amount of data. In one embodiment, step 1502 corresponds to steps 900-904 of FIG. 9. In one embodiment, step 1502 includes performing the process of FIG. 6 to program the data.

In step 1504, the control circuit programs second data into non-volatile storage at a second time including programming less than the minimum amount of data in order to program the second data (e.g., program a partial group of data). The programming second data does not include storing a temperature value for the second time in non-volatile memory at a corresponding location for the second data because the programming second data includes programming less than the minimum amount of data. In one embodiment, step 1504 corresponds to steps 1402-1406. In one embodiment, step 1504 includes performing the process of FIG. 6 to program the data.

In step 1506, the control circuit reads the first data, including performing differential temperature compensation during reading based on a differential between the temperature value for the first time and a current temperature value for the reading of the first data. In one embodiment, step 1506 corresponds to steps 906-916 or the process of FIG. 12 in combination with steps 906-916 (as discussed above).

In step 1508, the control circuit reads the second data without performing differential temperature compensation during reading based on a differential between the temperature value for the second time and a current temperature value for the reading of the second data. In one embodiment, step 1508 corresponds to steps 1408-1414.

Figure 16:
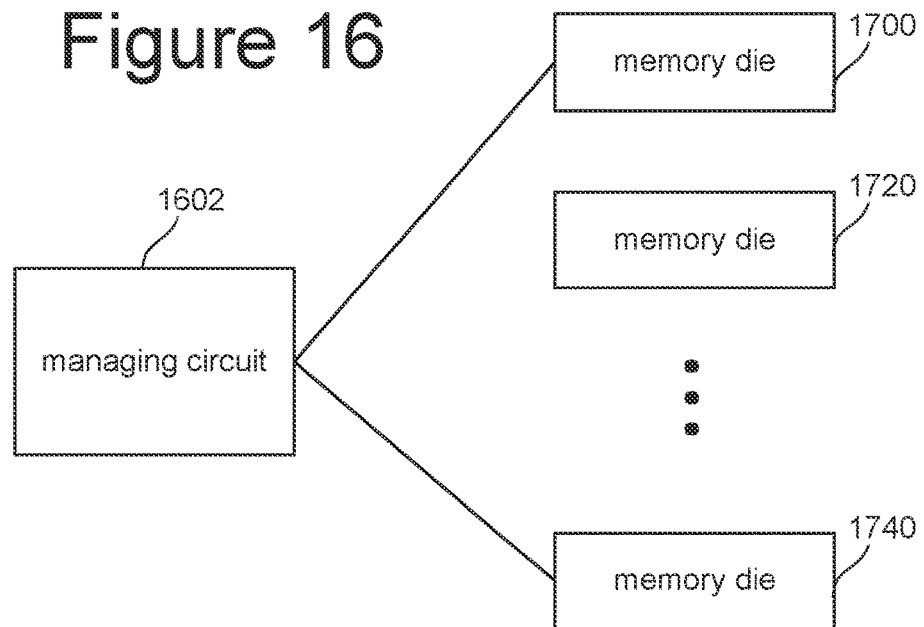
FIG. 16 is a block diagram depicting a portion of storage system.

As mentioned above, differential temperature compensation is useful for programming and reading a super page of data. A super page comprises multiple pages residing on different die. For example, FIG. 16 depicts a managing circuit 1602 connected to a plurality of memory dies 1700, 1720, . . . 1740 that store a super page. In some embodiments, managing circuit 1602 can be memory controller 120, control die 201 of an integrated memory assembly 207, or another processor configured to manage operation of a memory die. In some embodiments for which the managing circuit 1602 is a control die 201 of an integrated memory assembly 207, the memory system may also include a memory controller separate from and connected to the managing circuit such that the memory controller includes a host interface configured to communicate with a host and a memory interface configured to communicate with the managing circuit, and the control die is electrically connected to multiple memory die (e.g., two or more memory die).

Figure 17:
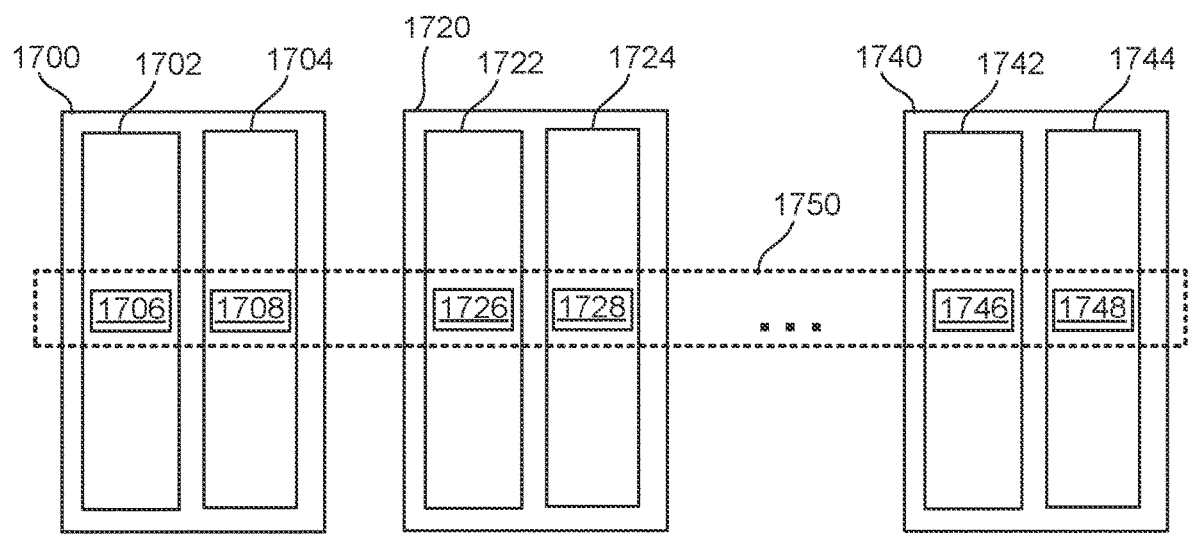
FIG. 17 is a block diagram depicting a portion of storage system, including a super block.

FIG. 17 depicts super page 1750 being stored across the plurality of memory dies 1700, 1720, . . . 1740. In the embodiment of FIG. 17, memory die 1700 includes two planes 1702 and 1704, memory die 1720 includes two planes 1722 and 1724, and memory die 1740 includes two planes 1742 and 1744. In this embodiment, each of the planes includes multiple pages (only one of which is depicted in FIG. 17). For example, plane 1702 on memory die 1700 includes page 1706, plane 1704 on memory die 1700 includes page 1708, plane 1722 on memory die 1720 includes page 1726, plane 1724 on memory die 1720 includes page 1728, plane 1742 on memory die 1740 includes page 1746, and plane 1744 on memory die 1740 includes page 1748. In one embodiment, each of pages 1706, 1708, 1726, 1728, 1746, and 1748 include all of the data stored in memory cells connected to a same word line and in a same sub-block; however, pages can also be other arrangements of data such as all data stored in all memory cells connected to a word line or a different subset of data stored in all or a subset of memory cells connected to one or more word lines. In the embodiment of FIG. 17, pages 1706, 1708, 1726, 1728, 1746, and 1748 together form super page 1750. In some embodiments, super page 1750 may also include additional pages from other memory dies.

FIG. 18 is a flow chart describing one embodiment of a process for programming and reading a super page of data with differential temperature compensation. In one example embodiment, the process of FIG. 18 is performed by any of the embodiments of a managing circuit discussed above. The managing circuit is connected to the memory cells in one or more memory dies (e.g., via control lines such as word lines, bit lines, source line and select lines), as described above with respect to FIGS. 1-4J.

In step 1802 of FIG. 18, the managing circuit programs a set of data into multiple non-volatile memory dies such that the set is stored in a data unit that spans the multiple non-volatile memory dies. One example of such a data unit is a super page, as discussed above. Other data units can also be used. In one embodiment, step 1802 includes using the process of FIG. 6 to program data in accordance with any of the schemes of FIGS. 5A-F. Data can be programmed to the multiple non-volatile memory dies concurrently or serially. In step 1804, the managing circuit stores a temperature in the volatile memory indicating time of programming for the data unit. In one embodiment, volatile memory 140 (or another volatile memory associated with or on a control die) includes a data structure that stores two byte temperature codes for each data unit. In another embodiment, volatile memory 140 (or another volatile memory associated with or on a control die) stores metadata MD for each data unit, such that the metadata for a data unit includes the two byte temperature code that indicates time of programming for the data unit. Steps 1802-1804 correspond to steps 900-904.

In step 1806, the managing circuit flushes the temperature at time of programming from the volatile memory to one or more of the non-volatile memory dies prior to powering off the non-volatile storage apparatus. For example, if storage system 100 is being powered off (including being reset), then prior to power being off the managing circuit will flush the temperature data indicating temperature at time of programming for the data unit from volatile memory 140 to non-volatile memory 130. In step 1808, the managing circuit loads the temperature data indicating temperature at time of programming for the data unit to the volatile memory from the one or more of the multiple non-volatile memory dies subsequent to powering on the non-volatile storage apparatus. Step 1808 can be performed in response to the power on process or in response to a read command (or read process) for the data unit. In step 1810, the managing circuit performs a read process for the set of data using differential temperature compensation based on a differential between the temperature at time of programming the set of data and temperature at time of reading for the set of data. Step 1810 corresponds to steps 906-916 of FIG. 9. In one embodiment, the managing circuit is configured to implement the process of FIG. 12 during step 1810 by performing a read process for the set of data without using differential temperature compensation (e.g., attempting to read at least a portion of the set of data) and the managing circuit is configured to perform the read process for the set of data using differential temperature compensation in response to the read process for the set of data without using differential temperature compensation failing. In one embodiment, the managing circuit is memory controller 120 and it is memory controller 120 that performs steps 1802-1810.

Figure 19A:
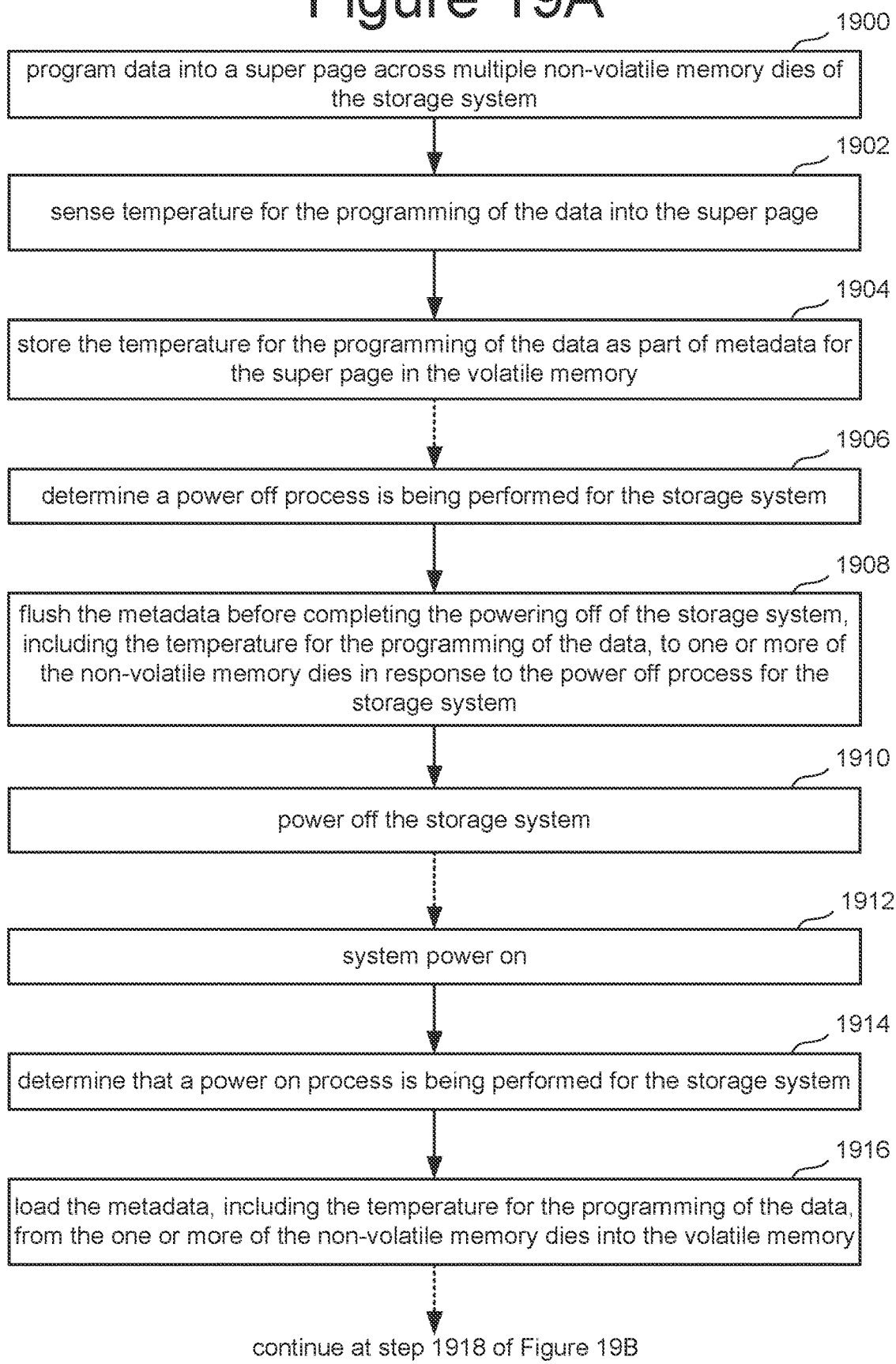
FIGS. 19A and 19B together form a flow chart describing one embodiment of a process for programming and reading data with differential temperature compensation.
Figure 19B:
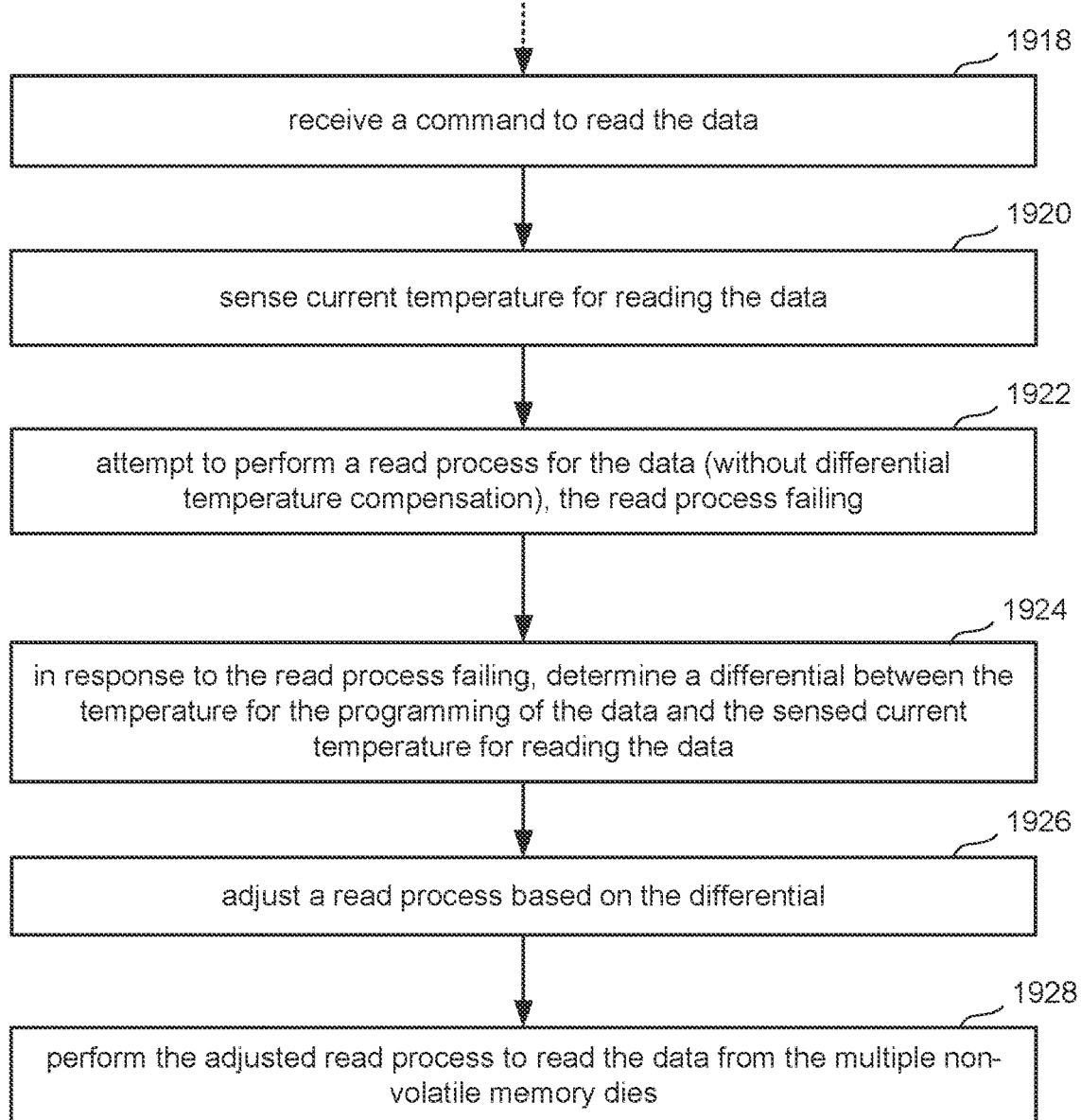

FIGS. 19A and 19B together form a flow chart describing one embodiment of a process for programming and reading a super page of data with differential temperature compensation. The process of FIGS. 19A and 19B is an example implementation of the process of FIG. 18. In one example embodiment, the process of FIGS. 19A and 19B is performed by any of the embodiments of a managing circuit discussed above. The managing circuit is connected to the memory cells in one or more memory dies (e.g., via control lines such as word lines, bit lines, source line and select lines), as described above with respect to FIGS. 1-4J. In one embodiment, the managing circuit is memory controller 120.

In step 1900, the managing circuit programs data into a super page across multiple non-volatile memory dies of the storage system. In step 1902, the managing circuit senses temperature for the programming of the data into the super page. For example, temperature sensor 165 or temperature sensor 261 can be used to sense the temperature at the memory dies at the time that the data is programmed. Step 1902 can be performed before, after or during step 1900. In step 1904, the managing circuit stores the temperature at time of programming the data as part of metadata for the super page in the volatile memory. In one embodiment, the temperature at time of programming is stored in the volatile memory as a two byte temperature code (e.g., in metadata MD of volatile memory 140—see FIG. 1). Steps 1900-1906 correspond to steps 1802-1804 and can include implementing steps 900-904 (including the processes of FIGS. 10 and/or 11).

In step 1906, the managing circuit determines a power off process is being performed for the storage system. For example, the managing circuit may have started a power off process (including a system reset), another component may have initiated a power off process that the managing circuit detected, the host may have requested a power off or reset, etc. The arrow from step 1904 to step 1906 is dotted to indicate that step 1906 may be performed immediately after step 1904 or at a later time. In step 1908, the managing circuit flushes the metadata before completing the powering off of the storage system, including the temperature for the programming of the data, to one or more of the non-volatile memory dies in response to the power off process for the storage system. For example, the temperature data for all super pages may be moved from metadata MD in volatile memory 140 to temperature data 202t in memory structure 202 in order to preserve the data after power if off (as volatile memory does not retain data after power is off). In step 1910, managing circuit (or another component) powers off the storage system (which, in some embodiments, can be part of a reset process).

In step 1912, the storage system (storage system 100 that includes the managing circuit and memory dies) powers on. The arrow from step 1910 to step 1912 is dotted to indicate that step 1906 may be performed immediately after step 1904 or at a later time. In step 1914, the managing circuit determines that a power on process is being performed for the storage. system. In step 1916, managing circuit loads the metadata, including the temperature at time of programming the super pages, from the one or more of the non-volatile memory dies (e.g., temperature data 202t in memory structure 202) into the volatile memory (e.g., metadata MD in volatile memory 140 or another volatile memory). In one embodiment, the managing circuit is configured to load the temperature at time of programming to the volatile memory from the one or more of the multiple non-volatile memory dies in response to the powering on process. In another embodiment, the managing circuit is configured to load the temperature at time of programming to the volatile memory from the one or more of the multiple non-volatile memory dies in response to receiving a read command for the data (all of the data or subset of the data).

In step 1918, the managing circuit receives a command to read the data (all or a subset of the data programmed in step 1900). The command can be received from a host or other entity. The arrow from step 1916 to step 1918 is dotted to indicate that step 1916 may be performed immediately after step 1918 or at a later time. In step 1920, the managing circuit senses current temperature for reading the data. For example, temperature sensor 165 or temperature sensor 261 can be used to sense the temperature at the memory dies at the time that the data is to be read. The managing circuit senses the current temperature in response to the received command to read the data. In step 1922, the managing circuit attempts to perform a read process for the data (without differential temperature compensation); however, the read process of step 1922 fails. In one embodiment, step 1922 includes performing a standard read process known in the art (see e.g., step 1414). In one embodiment, step 1920 is performed in response to the read process failing during step 1922. In step 1924, in response to the read process failing, the managing circuit determines a differential between the temperature for the programming of the data and the sensed current temperature for reading the data. In step 1926, adjusts a read process for the data to be read based on the differential determined in step 1924. In some embodiments, steps 1924 and 1926 are implemented by performing the processes of FIGS. 10 and/or 11. In step 1928, the managing circuit performs the adjusted read process (adjusted in step 1926) to read the data (all or a subset of the data programmed in step 1900) from the multiple non-volatile memory dies. In one embodiment, steps 1918-1928 correspond to step 1810 of FIG. 18 and steps 906-916 of FIG. 9.

Figure 20:
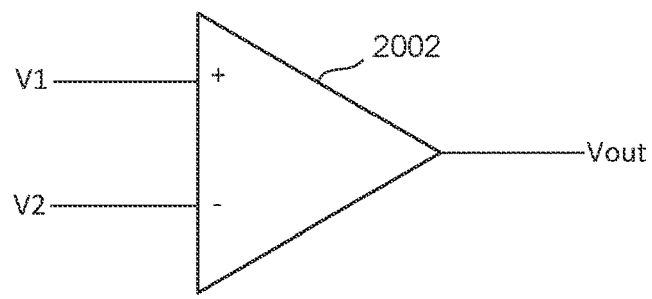
FIG. 20 depicts a comparator.

Steps 912 of FIG. 9, 1002 of FIG. 10, 1102 of FIG. 11, 1302 of FIG. 13, 1506 of FIG. 15, 1810 of FIG. 18, and 1924 of FIG. 19B include determining a differential between the temperature at time of the programming of the data and the sensed current temperature at time of reading. FIG. 20 depicts a comparator, which is one example embodiment for determining a differential between the temperature at time of the programming of the data and the temperature at time of reading. FIG. 20 shows a digital comparator 2002 that can be used compare the temperature at time of the programming with the temperature at time of reading. Digital comparator 2002 can be part of memory controller 120 or system control logic 260. Digital comparator 2002 has two inputs: V1 and V2. Input V1 is the two byte temperature code representing the temperature at time of programming. Input V2 is the output of a temperature sensor, representing the temperature at time of reading. The output of digital comparator 2002, Vout, is a two bit value as follows:

| Vout | Result |
| --- | --- |
| 00 | V1 = V2 |
| 01 | V1 > V2 |
| 10 | V2 < V1 |
| 11 | V1 = V2 |

Note that in other embodiments, digital comparator 2002 also outputs a magnitude of the difference between the temperature at time of the programming and the temperature at time of reading.

A system has been described that performs differential temperature compensation based on a differential between the temperature at time of programming for a set of data and the temperature at time of reading for the set of data.

One embodiment includes a non-volatile storage apparatus, comprising: a plurality of non-volatile memory cells configured to store data, the data divided into a plurality of groups of data; and a control circuit connected to the memory cells. The control circuit is configured to: program and read with differential temperature compensation based on a differential between temperature at time of programming and temperature at time of reading for data programmed as a complete group of data, and program and read without differential temperature compensation based on a differential between temperature at time of programming and temperature at time of reading for data programmed as a partial group of data.

One embodiment includes a method of operating non-volatile storage, comprising: programming first data into non-volatile memory at a first time including programming more than a minimum amount of data in order to program the first data, the programming first data includes accessing a temperature value for the first time and storing the temperature value for the first time in non-volatile memory at corresponding location for the first data in response to programming more than the minimum amount of data; programming second data into non-volatile storage at a second time including programming less than the minimum amount of data in order to program the second data, the programming second data does not include storing a temperature value for the second time in non-volatile memory at a corresponding location for the second data because the programming second data includes programming less than the minimum amount of data in order to program the second data; reading the first data, including performing differential temperature compensation during reading based on a differential between the temperature value for the first time and a current temperature value for the reading of the first data; and reading the second data without performing differential temperature compensation during reading based on a differential between the temperature value for the second time and a current temperature value for the reading of the second data.

One embodiment includes a non-volatile storage apparatus, comprising: a temperature sensor; a plurality of non-volatile memory cells configured to store data, the data divided into a plurality of groups of data; data storage configured to store temperature values, each group of data corresponds to a location in the data storage; and a control circuit connected to the memory cells and the data storage and the temperature sensor. The control circuit is configured to: program the memory cells, for each complete group of data programmed the control circuit stores a temperature for time of programming in a corresponding location in the data storage for the respective complete group of data, for each partial group of data programmed the control circuit does not store a temperature for time of programming in a corresponding location in the data storage for the respective partial group of data; and read a set of data from the memory cells corresponding to a particular group of data of the plurality of groups of data including: checking a particular location in the data storage corresponding to the particular group of data, determining whether a valid temperature is stored in the particular location, performing temperature compensation during the reading of the set of data based on a differential between the temperature stored in the particular location representing temperature at time of programming and current temperature for reading the set of data if valid temperature data is stored in the particular location, and reading of the set of data without performing temperature compensation based on a differential between temperature at time of programming and current temperature for reading the set of data if valid temperature data is not stored in the particular location.

One embodiment includes a non-volatile storage apparatus, comprising: a volatile memory; multiple non-volatile memory dies, each comprising a plurality of non-volatile memory cells; and a managing circuit connected to the non-volatile memory dies and the volatile memory. The managing circuit is configured to: program a set of data into the multiple non-volatile memory dies such that the set is stored in a data unit that spans the multiple non-volatile memory dies; store in the volatile memory a temperature at time of programming the set of data; flush the temperature at time of programming from the volatile memory to one or more of the non-volatile memory dies prior to powering off the non-volatile storage apparatus; load the temperature at time of programming to the volatile memory from the one or more of the multiple non-volatile memory dies subsequent to powering on the non-volatile storage apparatus; and perform a read process for the set of data using differential temperature compensation based on a differential between the temperature at time of programming the set of data and temperature at time of reading for the set of data.

One embodiment includes a method of operating a non-volatile storage system; comprising: programming data into a super page across multiple non-volatile memory dies of the non-volatile storage system, the non-volatile storage system further including a memory controller and volatile memory connected to the memory controller; sensing a temperature for programming the data into the super page; storing the temperature for programming the data in the volatile memory; determining a power off process is being performed for the non-volatile storage system; flushing the temperature for programming the data from the volatile memory to one or more of the non-volatile memory dies in response to the power off process; fetching the temperature for programming the data from the one or more of the non-volatile memory dies after a power on process for the non-volatile storage system; receiving a command to read the data at the controller; sensing a current temperature for reading the data; and reading the data with differential temperature compensation based on a differential between the temperature for reading the data and the temperature for programming the data.

One embodiment includes a method of a operating non-volatile storage system, comprising: programming data into a super page across multiple non-volatile memory dies of the storage system; sensing temperature for the programming of the data into the super page; storing the temperature for the programming of the data as part of metadata for the super page in the volatile memory; determining a power off process is being performed for the storage system; flushing the metadata, including the temperature for the programming of the data, to one or more of the non-volatile memory dies in response to the power off process for the storage system; determining a power on process is being performed for the storage system; loading the metadata, including the temperature for the programming of the data, from the one or more of the non-volatile memory dies into the volatile memory; receiving a command to read the data; sensing current temperature for reading the data; attempting to perform a read process for the data, the read process failing; in response to the read process failing, determining a differential between the temperature for the programming of the data and the sensed current temperature for reading the data; adjusting a read process based on the differential; and performing the adjusted read process to read the data from the multiple non-volatile memory dies.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a plurality of non-volatile memory cells configured to store data, the data divided into a plurality of groups of data; and
    a control circuit connected to the memory cells, the control circuit is configured to:
        program and read with differential temperature compensation based on a differential between temperature at time of programming and temperature at time of reading for data programmed as a complete group of data, and
        program and read without differential temperature compensation based on a differential between temperature at time of programming and temperature at time of reading for data programmed as a partial group of data.

2. The non-volatile storage apparatus of claim 1, wherein the control circuit is configured to program and read with differential temperature compensation by:
    storing the temperature at time of programming for the data programmed as the complete group of data;
    accessing the temperature at time of reading for the data programmed as the complete group of data;
    determining the differential between the temperature at time of programming and the temperature at time of reading;
    adjusting a read process for the complete group of data based on the differential; and
    performing the adjusted read process for at least a portion of the complete group of data.

3. The non-volatile storage apparatus of claim 1, wherein the control circuit is configured to program and read with differential temperature compensation by:
    storing the temperature at time of programming for the data programmed as the complete group of data;
    accessing the temperature at time of reading for the data programmed as the complete group of data;
    attempting to perform a read process for at least a portion of the complete group of data and determining that the attempted read process failed;
    in response to determining that the attempted read process failed, determining the differential between the temperature at time of programming and the temperature at time of reading;
    adjusting the read process for the portion of the complete group of data based on the differential; and
    performing the adjusted read process for the portion of the complete group of data.

4. The non-volatile storage apparatus of claim 1, wherein the control circuit is configured to program and read with differential temperature compensation by:
    storing the temperature at time of programming for the data programmed as the complete group of data;
    accessing the temperature at time of reading for the data programmed as the complete group of data;
    determining the differential between the temperature at time of programming and the temperature at time of reading;
    adjusting a sense time for a read process for at least a portion of the complete group of data based on the differential; and
    performing the adjusted read process for the portion of the complete group of data.

5. The non-volatile storage apparatus of claim 1, wherein the control circuit is configured to program and read with differential temperature compensation by:
    storing the temperature at time of programming for the data programmed as the complete group of data;
    accessing the temperature at time of reading for the data programmed as the complete group of data;
    determining the differential between the temperature at time of programming and the temperature at time of reading;
    adjusting bit line voltages applied to bit lines connected to the memory cells for a read process for at least a portion of the complete group of data based on the differential; and
    performing the adjusted read process for the portion of the complete group of data.

6. The non-volatile storage apparatus of claim 1, wherein:
    the control circuit includes a temperature sensor;
    the control circuit includes a plurality of sense amplifiers connected to the memory cells; and
    the control circuit is configured to program and read with differential temperature compensation by:
        sensing the temperature at time of programming for the data programmed as the complete group of data using the temperature sensor;
        storing the sensed temperature at time of programming;
        sensing a temperature at time of reading for the data programmed as the complete group of data using the temperature sensor;
        determining the differential between the temperature at time of programming and the temperature at time of reading; and
        adjusting the sense amplifiers for a read process for at least a portion of the complete group of data based on the differential.

7. The non-volatile storage apparatus of claim 1, wherein the control circuit is configured to program and read with differential temperature compensation by:
    storing the temperature at time of programming for the data programmed as the complete group of data;
    accessing the temperature at time of reading for the data programmed as the complete group of data;
    comparing the temperature at time of programming with the temperature at time of reading;
    adjusting a read process by shortening a sense time if temperature at time of reading is greater than temperature at time of programming and lengthening sense time if temperature at time of reading is less than temperature at time of programming; and performing the adjusted read process for the data programmed as the complete group of data.

8. The non-volatile storage apparatus of claim 1, further comprising:

bit lines connected to the memory cells and the control circuit; and word lines connected to the memory cells and the control circuit;

wherein the control circuit is configured to program and read with differential temperature compensation by:

storing the temperature at time of programming for the data programmed as the complete group of data, accessing the temperature at time of reading for the data programmed as the complete group of data, comparing the temperature at time of programming with the temperature at time of reading, adjusting a read process by lowering bit line voltages if temperature at time of reading is greater than temperature at time of programming and raising bit line voltages if temperature at time of reading is less than temperature at time of programming, and performing the adjusted read process for the data programmed as the complete group of data.

9. The non-volatile storage apparatus of claim 1, further comprising:

data storage configured to store temperature values, each group of data corresponds to a location in the data storage, the control circuit is in communication with the data storage.

10. The non-volatile storage apparatus of claim 9, wherein the control circuit is configured to program and read with differential temperature compensation by:

storing the temperature at time of programming for the data programmed as the complete group of data in a first location in the data storage corresponding to the complete group of data;

accessing the temperature at time of reading for the data programmed as the complete group of data;

determining the differential between the temperature at time of programming accessed from the first location and the temperature at time of reading;

adjusting a read process for the complete group of data based on the differential; and performing the adjusted read process for at least a portion of the complete group of data.

11. The non-volatile storage apparatus of claim 10, wherein the control circuit is configured to program and read without differential temperature compensation for the data programmed as the partial group of data by:

storing a flag in a location in the data storage corresponding to the partial group of data, the flag indicates that no valid temperature is stored therein;

accessing the flag at a time of reading the partial group of data;

in response to the flag, performing the read process for the partial group of data without adjustment based on differential between temperature at time of programming and temperature at time of reading.

12. The non-volatile storage apparatus of claim 10, wherein:

the read process for the partial group of data without adjustment based on differential between temperature at time of programming and temperature at time of reading includes an adjustment based on current temperature.

13. The non-volatile storage apparatus of claim 1, wherein:

the memory cells are configured to program data in units of pages; and the groups of data are each one hundred pages of data.

* * * * *